United States Patent
Pu et al.

(10) Patent No.: US 11,805,677 B2
(45) Date of Patent: Oct. 31, 2023

(54) DISPLAY SUBSTRATE, DISPLAY PANEL, AND MANUFACTURING METHOD OF DISPLAY SUBSTRATE

(71) Applicant: BOE TECHNOLOGY GROUP CO., LTD., Beijing (CN)

(72) Inventors: Chao Pu, Beijing (CN); Shengji Yang, Beijing (CN); Pengcheng Lu, Beijing (CN); Kuanta Huang, Beijing (CN); Junbo Wei, Beijing (CN); Li Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 346 days.

(21) Appl. No.: 16/967,226

(22) PCT Filed: Aug. 27, 2019

(86) PCT No.: PCT/CN2019/102884
§ 371 (c)(1),
(2) Date: Aug. 4, 2020

(87) PCT Pub. No.: WO2021/035545
PCT Pub. Date: Mar. 4, 2021

(65) Prior Publication Data
US 2021/0066402 A1 Mar. 4, 2021

(51) Int. Cl.
*H10K 59/121* (2023.01)
*H10K 50/15* (2023.01)
(Continued)

(52) U.S. Cl.
CPC ......... *H10K 59/121* (2023.02); *H10K 50/157* (2023.02); *H10K 50/167* (2023.02);
(Continued)

(58) Field of Classification Search
None
See application file for complete search history.

(56) References Cited

U.S. PATENT DOCUMENTS 9,306,191 B2 4/2016 Choe
9,893,128 B2 2/2018 Choi et al.
(Continued)

FOREIGN PATENT DOCUMENTS

CN 1825618 A 8/2006
CN 103779384 A 5/2014
(Continued)

OTHER PUBLICATIONS

Search report issued for European Application No. 19933204.0, dated Aug. 12, 2022, 10 pages.

*Primary Examiner* — Khaja Ahmad
(74) *Attorney, Agent, or Firm* — Dave Law Group LLC; Raj S. Dave

(57) ABSTRACT

A display substrate and a manufacturing method thereof, and a display panel are provided. The display substrate includes a base substrate, a first electrode, a light-emitting functional layer, and a second electrode. The light-emitting functional layer includes a first functional layer and a second functional layer, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers and is in contact with at least one side surface of the light-emitting functional layer and a portion of a surface of the light-emitting functional layer away from the base substrate.

20 Claims, 6 Drawing Sheets

(51) Int. Cl.
H10K 50/16 (2023.01)
H10K 50/17 (2023.01)
H10K 59/131 (2023.01)
H10K 71/00 (2023.01)

(52) U.S. Cl.
CPC ......... H10K 50/171 (2023.02); H10K 59/131 (2023.02); H10K 71/00 (2023.02)

(56) References Cited

U.S. PATENT DOCUMENTS

| | | | |
|---|---|---|---|
| 2004/0004431 A1* | 1/2004 | Nishikawa | H01L 51/52 313/504 |
| 2013/0256638 A1 | 10/2013 | Uesugi et al. | |
| 2014/0361260 A1* | 12/2014 | Kim | H01L 27/3246 438/23 |
| 2016/0056219 A1* | 2/2016 | Kim | H10K 30/865 257/40 |
| 2016/0190521 A1* | 6/2016 | Lee | H01L 27/326 257/40 |
| 2016/0211316 A1* | 7/2016 | Oh | H10K 59/1315 |
| 2017/0186989 A1 | 6/2017 | Hosono et al. | |
| 2019/0237527 A1* | 8/2019 | Lee | H01L 27/3246 |
| 2020/0111857 A1* | 4/2020 | Moon | H10K 59/124 |

FOREIGN PATENT DOCUMENTS

| | | |
|---|---|---|
| CN | 107230692 A | 10/2017 |
| CN | 109904205 A | 6/2019 |
| EP | 3518288 A1 | 7/2019 |
| JP | 2008071930 A | 3/2008 |

\* cited by examiner

DISPLAY SUBSTRATE, DISPLAY PANEL, AND MANUFACTURING METHOD OF DISPLAY SUBSTRATE

CROSS-REFERENCE TO RELATED APPLICATIONS

This application is the U.S. National Stage Entry of PCT/CN2019/102884 filed on Aug. 27, 2019, the entire disclosure of which is incorporated herein by reference as part of the disclosure of this application.

TECHNICAL FIELD

Embodiments of the present disclosure relate to a display substrate, a display panel, and a manufacturing method of a display substrate.

BACKGROUND

Organic light-emitting diode (OLED) display devices have advantages of the thin thickness, light weight, wide viewing angle, active light emission, continuously adjustable light emission color, low cost, fast response speed, low energy consumption, low driving voltage, wide operating temperature range, simple production process, high luminous efficiency, flexible display, etc., and have been widely used in display fields such as mobile phones, tablet computers, digital cameras, etc.

A silicon-based organic light-emitting diode (referred to as silicon-based OLED) display device is a new type of OLED display device with a silicon substrate as the base substrate. The silicon-based OLED display device has advantages of small size, high resolution, etc. The silicon-based OLED display device is made by a mature integrated circuit CMOS process, achieves active addressing of pixels, and has a variety of circuit structures such as TCON (a control board or a logic board), OCP (an operation control panel), etc., which may achieve lightweight design.

SUMMARY

At least one embodiment of the present disclosure provides a display substrate, and the display substrate includes a base substrate, a first electrode, a light-emitting functional layer, and a second electrode; the first electrode is on the base substrate, the light-emitting functional layer is on a side of the first electrode away from the base substrate, the second electrode is on a side of the light-emitting functional layer away from the first electrode, and the first electrode, the light-emitting functional layer, and the second electrode constitute a light-emitting element; the light-emitting functional layer includes a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate.

For example, in the display substrate provided by at least one embodiment of the present disclosure, a surface of the first functional layer away from the base substrate includes a portion covered by the second functional layer, and a portion of the surface of the first functional layer away from the base substrate except for the portion covered by the second functional layer is in contact with the second electrode.

For example, in the display substrate provided by at least one embodiment of the present disclosure, an outline of the orthographic projection of the first functional layer on the base substrate is approximately identical to an outline of the orthographic projection of the second functional layer on the base substrate.

For example, in the display substrate provided by at least one embodiment of the present disclosure, a center of the orthographic projection of the first functional layer on the base substrate substantially coincides with a center of the orthographic projection of the second functional layer on the base substrate.

For example, in the display substrate provided by at least one embodiment of the present disclosure, a portion of the second electrode covering the at least one side surface of the light-emitting functional layer has a component extending laterally along a surface of the base substrate.

For example, in the display substrate provided by at least one embodiment of the present disclosure, the first functional layer is in contact with the second functional layer, the surface of the first functional layer away from the base substrate includes a portion in contact with the second functional layer and the portion in contact with the second electrode, a side surface of the first functional layer, the portion in contact with the second electrode of the surface of the first functional layer away from the base substrate, and a side surface of the second functional layer are in contact with each other and form a first step structure on the at least one side surface of the light-emitting functional layer, and the second electrode covers the first step structure and is in contact with the first step structure.

For example, in the display substrate provided by at least one embodiment of the present disclosure, the light-emitting functional layer further includes a third functional layer on a side of the second functional layer away from the base substrate, an orthographic projection of an edge of the third functional layer on the base substrate is within the orthographic projection of the edge of the second functional layer on the base substrate, and an area of an orthographic projection of the third functional layer on the base substrate is smaller than the area of the orthographic projection of the second functional layer on the base substrate.

For example, in the display substrate provided by at least one embodiment of the present disclosure, the second functional layer is in contact with the third functional layer, a surface of the second functional layer away from the base substrate includes a portion in contact with the third functional layer and a portion in contact with the second electrode, the side surface of the second functional layer, the portion in contact with the second electrode of the surface of the second functional layer away from the base substrate, and a side surface of the third functional layer are in contact with each other and form a second step structure on the at least one side surface of the light-emitting functional layer, and the second electrode covers the second step structure and is in contact with the second step structure.

For example, in the display substrate provided by at least one embodiment of the present disclosure, a portion of the second electrode covering the first step structure and a portion of the second electrode covering the second step structure provide a first ladder structure on the at least one side surface of the light-emitting functional layer.

For example, in the display substrate provided by at least one embodiment of the present disclosure, the light-emitting functional layer further includes a fourth functional layer on a side of the third functional layer away from the base substrate, an orthographic projection of an edge of the fourth functional layer on the base substrate is within the orthographic projection of the edge of the third functional layer on the base substrate, and an area of an orthographic projection of the fourth functional layer on the base substrate is smaller than the area of the orthographic projection of the third functional layer on the base substrate.

For example, in the display substrate provided by at least one embodiment of the present disclosure, the third functional layer is in contact with the fourth functional layer, a surface of the third functional layer away from the base substrate includes a portion in contact with the fourth functional layer and a portion in contact with the second electrode, the side surface of the third functional layer, the portion in contact with the second electrode of the surface of the third functional layer away from the base substrate, and a side surface of the fourth functional layer are in contact with each other and form a third step structure on the at least one side surface of the light-emitting functional layer, and the second electrode covers the third step structure and is in contact with the third step structure.

For example, in the display substrate provided by at least one embodiment of the present disclosure, the portion of the second electrode covering the second step structure and a portion of the second electrode covering the third step structure provide a second ladder structure on the at least one side surface of the light-emitting functional layer.

For example, in the display substrate provided by at least one embodiment of the present disclosure, the light-emitting functional layer further includes a fifth functional layer on a side of the fourth functional layer away from the base substrate, an orthographic projection of an edge of the fifth functional layer on the base substrate is within the orthographic projection of the edge of the fourth functional layer on the base substrate, and an area of an orthographic projection of the fifth functional layer on the base substrate is smaller than the area of the orthographic projection of the fourth functional layer on the base substrate.

For example, in the display substrate provided by at least one embodiment of the present disclosure, the fourth functional layer is in contact with the fifth functional layer, a surface of the fourth functional layer away from the base substrate includes a portion in contact with the fifth functional layer and a portion in contact with the second electrode, the side surface of the fourth functional layer, the portion in contact with the second electrode of the surface of the fourth functional layer away from the base substrate, and a side surface of the fifth functional layer are in contact with each other and form a fourth step structure on the at least one side surface of the light-emitting functional layer, and the second electrode covers the fourth step structure and is in contact with the fourth step structure.

For example, in the display substrate provided by at least one embodiment of the present disclosure, the portion of the second electrode covering the third step structure and a portion of the second electrode covering the fourth step structure provide a third ladder structure on the at least one side surface of the light-emitting functional layer.

For example, in the display substrate provided by at least one embodiment of the present disclosure, the first functional layer is a hole injection layer, the second functional layer is a hole transport layer, the third functional layer is a light-emitting layer, the fourth functional layer is an electron transport layer, and the fifth functional layer is an electron injection layer.

For example, in the display substrate provided by at least one embodiment of the present disclosure, the display substrate includes a display region and a peripheral region around the display region, the display substrate further includes an auxiliary electrode in the peripheral region, the auxiliary electrode is at least partially around the display region, the first electrode is in the display region, and the second electrode is in the display region and the peripheral region and is electrically connected to the auxiliary electrode through a via hole or by direct contact in the peripheral region.

For example, in the display substrate provided by at least one embodiment of the present disclosure, the base substrate is a silicon substrate, the silicon substrate includes a pixel driving circuit, and the pixel driving circuit is configured to be electrically connected to the first electrode.

For example, in the display substrate provided by at least one embodiment of the present disclosure, the auxiliary electrode and the first electrode are in an identical layer and insulated from each other, and a material of the auxiliary electrode is identical to a material of the first electrode.

For example, in the display substrate provided by at least one embodiment of the present disclosure, the peripheral region includes a connection electrode region and a sensor region, the connection electrode region is at least partially around the sensor region, the sensor region is at least partially around the display region, the auxiliary electrode is in the connection electrode region, and an orthographic projection of the sensor region on the base substrate is within an orthographic projection of any one of functional layers of the light-emitting functional layer on the base substrate.

For example, in the display substrate provided by at least one embodiment of the present disclosure, the peripheral region further includes a first dummy sub-region and a second dummy sub-region, the connection electrode region is at least partially around the first dummy sub-region, and the first dummy sub-region is at least partially around the sensor region; the sensor region is at least partially around the second dummy sub-region, and the second dummy sub-region is at least partially around the display region; and the light-emitting functional layer is in the display region, the second dummy sub-region, the sensor region, and the first dummy sub-region.

For example, in the display substrate provided by at least one embodiment of the present disclosure, in a case where the auxiliary electrode is in contact with a side surface of the first functional layer, a first step structure includes the portion, in contact with the second electrode, of the surface of the first functional layer away from the base substrate, and a side surface of the second functional layer.

For example, the display substrate provided by at least one embodiment of the present disclosure further includes a color filter layer, the color filter layer is on a side of the second electrode away from the base substrate, and an orthographic projection of the light-emitting functional layer on the base substrate is within an orthographic projection of the color filter layer on the base substrate.

For example, in the display substrate provided by at least one embodiment of the present disclosure, the display substrate is an organic light-emitting diode display substrate or a quantum dot light-emitting diode display substrate.

At least one embodiment of the present disclosure further provides a display panel, including the display substrate according to any one of the embodiments of the present disclosure.

At least one embodiment of the present disclosure further provides a manufacturing method of a display substrate, and the manufacturing method includes: providing a base substrate; forming a first electrode on the base substrate; forming a light-emitting functional layer on the first electrode; and forming a second electrode on the light-emitting functional layer; the first electrode, the light-emitting functional layer, and the second electrode constitute a light-emitting element, the light-emitting functional layer includes a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate.

For example, in the manufacturing method provided by at least one embodiment of the present disclosure, a surface of the first functional layer away from the base substrate includes a portion covered by the second functional layer, and a portion of the surface of the first functional layer away from the base substrate except for the portion covered by the second functional layer is in contact with the second electrode.

For example, in the manufacturing method provided by at least one embodiment of the present disclosure, a portion of the second electrode covering the at least one side surface of the light-emitting functional layer has a component extending laterally along a surface of the base substrate.

For example, in the manufacturing method provided by at least one embodiment of the present disclosure, the first functional layer is in contact with the second functional layer, the surface of the first functional layer away from the base substrate includes a portion in contact with the second functional layer and the portion in contact with the second electrode, a side surface of the first functional layer, the portion in contact with the second electrode of the surface of the first functional layer away from the base substrate, and a side surface of the second functional layer are in contact with each other and form a first step structure on the at least one side surface of the light-emitting functional layer, and the second electrode covers the first step structure and is in contact with the first step structure.

For example, the manufacturing method provided by at least one embodiment of the present disclosure further includes forming a third functional layer on a side of the second functional layer away from the base substrate, an orthographic projection of an edge of the third functional layer on the base substrate is within the orthographic projection of the edge of the second functional layer on the base substrate, and an area of an orthographic projection of the third functional layer on the base substrate is smaller than the area of the orthographic projection of the second functional layer on the base substrate.

For example, in the manufacturing method provided by at least one embodiment of the present disclosure, the second functional layer is in contact with the third functional layer, a surface of the second functional layer away from the base substrate includes a portion in contact with the third functional layer and a portion in contact with the second electrode, the side surface of the second functional layer, the portion in contact with the second electrode of the surface of the second functional layer away from the base substrate, and a side surface of the third functional layer are in contact with each other and form a second step structure on the at least one side surface of the light-emitting functional layer, and the second electrode covers the second step structure and is in contact with the second step structure.

For example, in the manufacturing method provided by at least one embodiment of the present disclosure, a portion of the second electrode covering the first step structure and a portion of the second electrode covering the second step structure provide a first ladder structure on the at least one side surface of the light-emitting functional layer.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
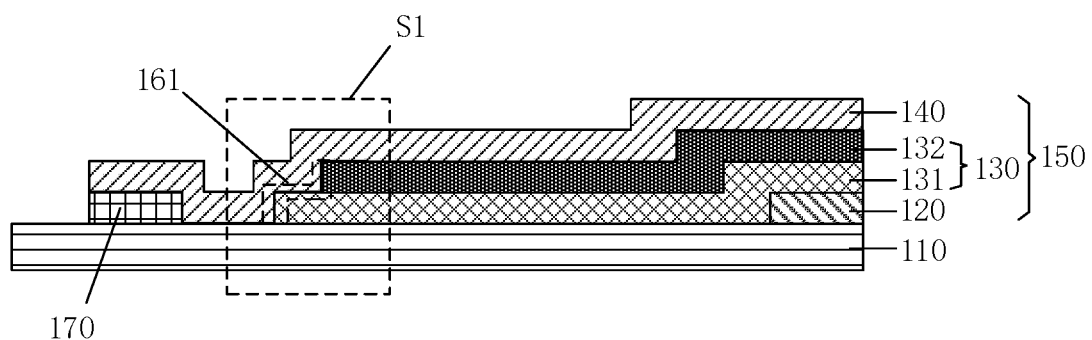
FIG. 1A is a schematic diagram of a partial cross-sectional structure of a display substrate provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, silicon-based OLED display devices have advantages of small size, high resolution, etc., and are widely used in near-eye display fields such as virtual reality (VR), augmented reality (AR), or the like. However, edges of film layers of the light-emitting element in the silicon-based OLED display device are usually aligned, and the total thickness of the film layers of the light-emitting element is thick. Therefore, in the light-emitting element, the cathode (or anode) on the light-emitting functional layer tends to have a large drop at the edge of the film layer, so that the cathode (or anode) may be prone to being disconnected at the edge of the film layer, which may have a serious adverse effect on the electrical connection performance of the cathode (or anode), thereby reducing the overall performance and service life of the silicon-based OLED display device.

At least one embodiment of the present disclosure provides a display substrate, and the display substrate may reduce a drop of an electrode on a light-emitting functional layer in a light-emitting element along a side surface of the light-emitting functional layer, that is, the drop of the electrode at the edge of the film layer of the light-emitting element is reduced, so that the risk of the electrode being disconnected at the edge of the film layer of the light-emitting element is reduced or avoided, and the electrical connection performance of the electrode is significantly improved, thereby improving the overall performance and service life of the display substrate, and further improving the overall performance and service life of the display panel or display device including the display substrate.

Hereinafter, some embodiments of the present disclosure are described in detail with reference to the accompanying drawings. It should be noted that the same reference numerals used in different drawings refer to the same described elements.

At least one embodiment of the present disclosure provides a display substrate, and the display substrate includes a base substrate, a first electrode, a light-emitting functional layer, and a second electrode. The first electrode is on the base substrate, the light-emitting functional layer is on a side of the first electrode away from the base substrate, the second electrode is on a side of the light-emitting functional layer away from the first electrode, the first electrode, the light-emitting functional layer, and the second electrode constitute a light-emitting element, and the second electrode further covers at least one side surface of the light-emitting functional layer and a portion of a surface of the light-emitting functional layer away from the base substrate; the light-emitting functional layer includes a first functional layer and a second functional layer on a side of the first functional layer away from the base substrate; and a shape of the at least one side surface of the light-emitting functional layer is configured to allow a portion of the second electrode covering the at least one side surface of the light-emitting functional layer to have a component extending laterally along a surface of the base substrate.

In the display substrate provided by at least one embodiment of the present disclosure, the portion, which covers the at least one side surface of the light-emitting functional layer, of the second electrode in the light-emitting element has a component extending laterally along the surface of the base substrate, for example, the portion of the second electrode covering the at least one side surface of the light-emitting functional layer is in a ladder shape or in a slope shape along the side surface of the light-emitting functional layer, so that the drop of the portion of the second electrode covering the at least one side surface of the light-emitting functional layer in the direction perpendicular to the surface of the base substrate is reduced, that is, the drop of the second electrode at the edge of the film layer of the light-emitting element is reduced. Therefore, the risk of the second electrode being disconnected at the edge of the film layer of the light-emitting element is reduced or avoided, so that the electrical connection performance of the second electrode is significantly improved, thereby improving the overall performance and service life of the display substrate, and further improving the overall performance and service life of the display panel or display device including the display substrate.

For example, in some embodiments of the present disclosure, in order to allow the portion, which covers the at least one side surface of the light-emitting functional layer, of the second electrode of the light-emitting element to have a component extending laterally along the surface of the base substrate, the portion of the second electrode covering the at least one side surface of the light-emitting functional layer may have a ladder shape, a slope shape, or other suitable shapes, and the embodiments of the present disclosure are not limited in this aspect.

At least one embodiment of the present disclosure provides a display substrate, and the display substrate includes a base substrate, a first electrode, a light-emitting functional layer, and a second electrode. The first electrode is on the base substrate, the light-emitting functional layer is on a side of the first electrode away from the base substrate, the second electrode is on a side of the light-emitting functional layer away from the first electrode, and the first electrode, the light-emitting functional layer, and the second electrode constitute a light-emitting element. The light-emitting functional layer includes a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate.

In the display substrate provided by at least one embodiment of the present disclosure, the first functional layer and the second functional layer are designed to cooperate, and for example, the first functional layer and the second functional layer form a slope structure or a step structure at the edge of the film layer of the light-emitting element, so that the portion of the second electrode covering and being in contact with the at least one side surface of the light-emitting functional layer is in a slope shape or in a ladder shape along the side surface of the light-emitting functional layer, thereby reducing the drop of the portion of the second electrode covering the at least one side surface of the light-emitting functional layer in the direction perpendicular to the surface of the base substrate, that is, reducing the drop of the second electrode at the edge of the film layer of the light-emitting element. Therefore, the risk of the second electrode being disconnected at the edge of the film layer of the light-emitting element may be reduced or avoided, so that the electrical connection performance of the second electrode is significantly improved, thereby improving the overall performance and service life of the display substrate, and further improving the overall performance and service life of the display panel or display device including the display substrate.

In the following, the structure and function of the display substrate provided by some embodiments of the present disclosure are specifically described by taking the case where the portion of the second electrode covering the side surface of the light-emitting functional layer is in a ladder shape as an example.

FIG. 1A is a schematic diagram of a partial cross-sectional structure of a display substrate provided by some embodiments of the present disclosure, and for example, is a schematic diagram illustrating a structure at an edge of a film layer of a light-emitting element of the display substrate. For example, as illustrated in FIG. 1A, the display substrate 10 includes a base substrate 110, a first electrode 120, a light-emitting functional layer 130, and a second electrode 140. The first electrode 120 is located on the base substrate 110, the light-emitting functional layer 130 is located on a side of the first electrode 120 away from the base substrate 110, and the second electrode 140 is located on a side of the light-emitting functional layer 130 away from the first electrode 120. The first electrode 120, the light-emitting functional layer 130, and the second electrode 140 constitute a light-emitting element 150, and the second electrode 140 further covers at least one side surface of the light-emitting functional layer 130 and a portion of a surface of the light-emitting functional layer 130 away from the base substrate 110.

For example, as illustrated in FIG. 1A, the light-emitting functional layer 130 includes a first functional layer 131 and a second functional layer 132 located on a side of the first functional layer 131 away from the base substrate 110. The first functional layer 131 covers at least one side surface of the first electrode 120 and a portion of a surface of the base substrate 110. An orthographic projection of an edge of the second functional layer 132 on the base substrate 110 is within an orthographic projection of an edge of the first functional layer 131 on the base substrate 110, and an area of an orthographic projection of the second functional layer 132 on the base substrate 110 is smaller than an area of an orthographic projection of the first functional layer 131 on the base substrate 110. Therefore, the edge of the first functional layer 131 and the edge of the second functional layer 132 are arranged in a misaligned manner, so that the portion, which covers and is in contact with the side surface of the first functional layer 131 and the side surface of the second functional layer 132, of the second electrode 140 has a component extending laterally along the surface of the base substrate 110.

For example, as illustrated in FIG. 1, a surface of the first functional layer 131 away from the base substrate 110 includes a portion covered by the second functional layer 132, and a portion of the surface of the first functional layer 131 away from the base substrate 110 except for the portion covered by the second functional layer 132 is in contact with the second electrode 140, so that the drop of the portion, which covers and is in contact with the side surface of the first functional layer 131 and the side surface of the second functional layer 132, of the second electrode 140 in the direction perpendicular to the surface of the base substrate 110 is reduced.

For example, an outline of the orthographic projection of the first functional layer 131 on the base substrate 110 is approximately identical to an outline of the orthographic projection of the second functional layer 132 on the base substrate 110. That is, the outline of the first functional layer 131 and the outline of the second functional layer 132 may be substantially the same, and for example, may be square or other suitable shapes.

For example, a center of the orthographic projection of the first functional layer 131 on the base substrate 110 substantially coincides with a center of the orthographic projection of the second functional layer 132 on the base substrate 110, so that in the case where the outline of the first functional layer 131 is substantially the same as the outline of the second functional layer 132, distances between the edge of the first functional layer 131 and the edge of the second functional layer 132 at different positions may be approximately the same.

It should be noted that, in the embodiments of the present disclosure, the specific distance between the edge of the first functional layer 131 and the edge of the second functional layer 132 may be set according to the specific structure of the display substrate 10 or different actual requirements, and the embodiments of the present disclosure do not limit this.

For example, as illustrated in FIG. 1A, the edge portion of the second functional layer 132 is in direct contact with the first functional layer 131, that is, there is no film layer or structure between the first functional layer 131 and the edge portion of the second functional layer 132.

For example, as illustrated in FIG. 1A, the surface of the first functional layer 131 away from the base substrate 110 includes the portion in contact with the second functional layer 132 and the portion in contact with the second electrode 140. A side surface of the first functional layer 131, the portion, which is in contact with the second electrode 140, of the surface of the first functional layer 131 away from the base substrate 110, and a side surface of the second functional layer 132 are in contact with each other and form a first step structure 161 (as illustrated by a dotted block in FIG. 1A) on the at least one side surface of the light-emitting functional layer 130, and the second electrode 140 covers the first step structure 161 and is in contact with the first step structure 161.

For example, the shape, the size, or the like of the first step structure 161 may be adjusted correspondingly according to the sizes, position relationship, or the like of the first functional layer 131 and the second functional layer 132, which is not limited in the embodiments of the present disclosure.

The first step structure 161 may allow the portion, covering the side surface of the first functional layer 131 and the side surface of the second functional layer 132, of the second electrode 140 to have a ladder shape, thereby reducing the drop of the portion, covering the side surface of the first functional layer 131 and the side surface of the second functional layer 132, of the second electrode 140 in the direction perpendicular to the surface of the base substrate 110, that is, reducing the drop of the second electrode 140 at the edge of the film layer of the light-emitting element 150. Therefore, the first step structure 161 may reduce or avoid the phenomenon of the second electrode 140 being disconnected at the edge of the film layer of the light-emitting element 150, so that the electrical connection performance of the second electrode 140 is significantly improved.

For example, in some embodiments of the present disclosure illustrated in FIG. 1A, the first electrode 120 is an anode, and the second electrode 140 is a cathode; or, the first electrode 120 is a cathode, and the second electrode 140 is an anode, which is not limited by the embodiments of the present disclosure. In the following embodiments, the setting of the first electrode 120 and the second electrode 140 may be basically the same or similar to those described herein, and details will not be described again.

For example, the anode may be made of a transparent conductive material, and for example, the transparent conductive material includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc., so as to provide a high transmittance, a high work function, or the like. For example, the cathode may be made of metal, such as magnesium, silver, or the like, and an alloy material thereof, or may be made of a transparent conductive material.

For example, in some embodiments of the present disclosure illustrated in FIG. 1A, the first functional layer 131 and the second functional layer 132 may be a hole injection layer and a light-emitting layer, respectively; alternatively, the first functional layer 131 and the second functional layer 132 may be a hole transport layer and a light-emitting layer, respectively; alternatively, the first functional layer 131 and the second functional layer 132 may be a light-emitting layer and an electron transport layer, respectively; or, the first functional layer 131 and the second functional layer 132 may be a light-emitting layer and an electron injection layer, respectively. The embodiments of the present disclosure do not limit this.

For example, a material of the light-emitting layer may be selected according to the color of the light emitted by the light-emitting layer, and the material of the light-emitting layer includes a fluorescent light-emitting material or a phosphorescent light-emitting material. Currently, a doping system is usually adopted, that is, a dopant material is mixed in the host light-emitting material to obtain a usable light-emitting material. For example, the host light-emitting material may be a metal compound material, an anthracene derivative, an aromatic diamine compound, a triphenylamine compound, an aromatic melamine compound, a biphenyl diamine derivative, a triarylamine polymer, or the like.

For example, the base substrate 110 may be a wafer (a silicon wafer), and the first electrode 120 may be formed on the base substrate 110, for example, by a chemical vapor deposition method. This process may be prepared through the conventional process used by a wafer manufacturer or a light-emitting element manufacturer (for example, an OLED display device manufacturer), and the embodiments of the present disclosure are not limited in this aspect.

For example, the first functional layer 131 and the second functional layer 132 may be vapor-deposited on the base substrate 110, which is prepared with the first electrode 120, by using a mask. In this process, it is necessary to strictly control the evaporation regions of the first functional layer 131 and the second functional layer 132, so as to allow the film layer edge of the first functional layer 131 and the film layer edge of the second functional layer 132 to form the first step structure 161, and further to allow the portion, covering the side surface of the first functional layer 131 and the side surface of the second functional layer 132, of the second electrode 140 which is subsequently vapor-deposited on the base substrate 110 to have a ladder shape.

It should be noted that, the process of using the mask to vapor-deposit the first functional layer 131 and the second functional layer 132 to allow the film layer edge of the first functional layer 131 and the film layer edge of the second functional layer 132 to form the step structure, the process of using the mask to vapor-deposit the second electrode 140 to allow the portion, covering the side surface of the first functional layer 131 and the side surface of the second functional layer 132, of the second electrode 140 to have the ladder shape, and the like are conventional manufacturing processes in the art, and details are not described herein.

It should be noted that, during the actual manufacturing process of the display substrate 10, shapes of the film layer edges of the first electrode 120, the second electrode 140, the first functional layer 131, and the second functional layer 132 may be, for example, circular arc shapes or slope shapes, or may be other suitable shapes according to actual process requirements. The right-angle shape of the film layer edge illustrated in FIG. 1A is only a schematic illustration. The following embodiments are basically the same as those described herein, and details will not be described again.

Figure 1B:
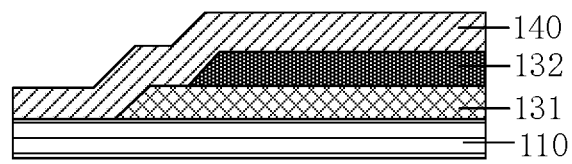
FIG. 1B is a schematic diagram of a specific example of a portion S1 illustrated in FIG. 1A.

For example, as illustrated in FIG. 1B, during the actual manufacturing process of the display substrate 10, at the position S1 of the display substrate 10 illustrated in FIG. 1A, the film layer edges of the second electrode 140, the second functional layer 132, and the first functional layer 131 may be sloped. That is, the film thicknesses of the edge portion of the second electrode 140, the edge portion of the second functional layer 132, and the edge portion of the first functional layer 131 are gradually reduced.

For example, as illustrated in FIG. 1A, the display substrate 10 further includes an auxiliary electrode 170, and the auxiliary electrode 170 is directly provided on the base substrate 110.

Figure 2:
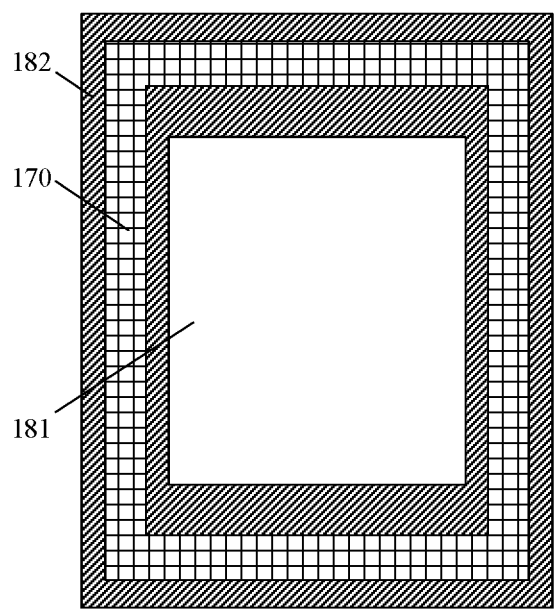
FIG. 2 is a schematic diagram of a partial planar structure of a display substrate provided by some embodiments of the present disclosure.

FIG. 2 is a schematic diagram of a partial planar structure of a display substrate provided by some embodiments of the present disclosure, and for example, is a bottom view of the display substrate 10 illustrated in FIG. 1A.

For example, as illustrated in FIG. 1A and FIG. 2, the display substrate 10 includes a display region 181 and a peripheral region 182 around the display region 181. The auxiliary electrode 170 is located in the peripheral region 182 and is at least partially around the display region 181, and for example, the auxiliary electrode 170 may have a ring shape. The first electrode 120 and at least part of the light-emitting functional layer 130 are located in the display region 181, the second electrode 140 is located in the display region 181 and the peripheral region 182, and in the peripheral region 182, the second electrode 140 is in direct contact with the auxiliary electrode 170 to achieve electrical connection. For example, in the peripheral region 182, the second electrode 140 may also be electrically connected to the auxiliary electrode 170 through a via hole.

For example, the auxiliary electrode 170 may be electrically connected to a power signal line on the base substrate 110 for providing an electrical signal, such as a second electrode driving current or voltage, so that the second electrode 140 may be electrically connected to the power signal line through the auxiliary electrode 170 to receive the electrical signal. Because the auxiliary electrode 170 is disposed in the peripheral region 182, the size of the auxiliary electrode 170 may be relatively large, so that the contact area between the second electrode 140 and the auxiliary electrode 170 can be increased, or the size of the via hole or the number of via holes provided between the second electrode 140 and the auxiliary electrode 170 can be increased, thereby further improving the electrical connection performance of the second electrode 140.

For example, as illustrated in FIG. 1A, the auxiliary electrode 170 and the first electrode 120 may be disposed in an identical layer and insulated from each other, a material of the auxiliary electrode 170 is the same as a material of the first electrode 120, and therefore, the auxiliary electrode 170 and the first electrode 120 can be manufactured by the same process, thereby simplifying the manufacturing process of the display substrate 10 and reducing the manufacturing cost of the display substrate 10.

It should be noted that, in some other embodiments of the present disclosure, the auxiliary electrode 170 may also be manufactured by using other suitable conductive materials different from the material of the first electrode 120. The embodiments of the present disclosure do not limit the material and the manufacturing method of the auxiliary electrode 170.

For example, in some embodiments of the present disclosure as illustrated in FIG. 1A, the first functional layer 131 includes a portion which is on the same layer as the auxiliary electrode 170 and the first electrode 120, a gap is provided between the first functional layer 131 and the auxiliary electrode 170, and the gap is filled with the second electrode 140. For example, according to different actual requirements, the display substrate 10 may further include other structures or components provided between the first functional layer 131 and the auxiliary electrode 170, and the embodiments of the present disclosure are not limited thereto.

Figure 3A:
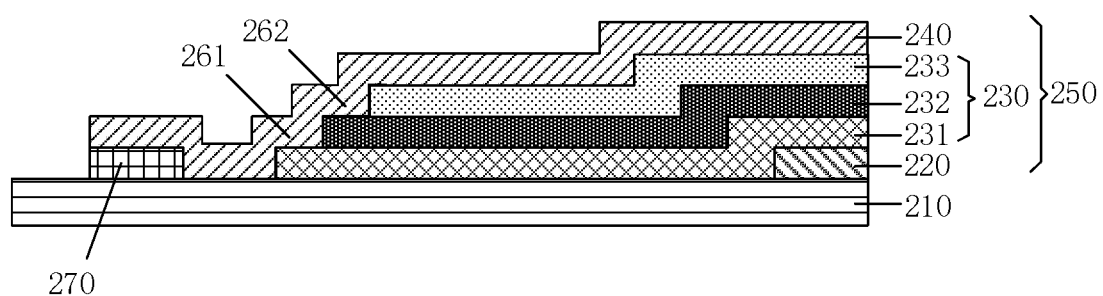
FIG. 3A is a schematic diagram of a partial cross-sectional structure of another display substrate provided by some embodiments of the present disclosure.

FIG. 3A is a schematic diagram of a partial cross-sectional structure of another display substrate provided by some embodiments of the present disclosure, and for example, is a schematic diagram illustrating a structure at an edge of a film layer of a light-emitting element of the display substrate. For example, as illustrated in FIG. 3A, the display substrate 20 includes a base substrate 210, a first electrode 220, a light-emitting functional layer 230, and a second electrode 240. The first electrode 220 is located on the base substrate 210, the light-emitting functional layer 230 is located on a side of the first electrode 220 away from the base substrate 210, and the second electrode 240 is located on a side of the light-emitting functional layer 230 away from the first electrode 220. The first electrode 220, the light-emitting functional layer 230, and the second electrode 240 constitute a light-emitting element 250, and the second electrode 240 further covers at least one side surface of the light-emitting functional layer 230 and a portion of a surface of the light-emitting functional layer 230 away from the base substrate 210.

For example, as illustrated in FIG. 3A, the light-emitting functional layer 230 includes a first functional layer 231, a second functional layer 232 located on a side of the first functional layer 231 away from the base substrate 210, and a third functional layer 233 on a side of the second functional layer 232 away from the base substrate 210. The first functional layer 231 is in direct contact with the second functional layer 232, and the second functional layer 232 is in direct contact with the third functional layer 233. The first functional layer 231 covers at least one side surface of the first electrode 220 and a portion of the surface of the base substrate 210. The orthographic projection of the edge of the second functional layer 232 on the base substrate 210 is within the orthographic projection of the edge of the first functional layer 231 on the base substrate 210, and the area of the orthographic projection of the second functional layer 232 on the base substrate 210 is smaller than the area of the orthographic projection of the first functional layer 231 on the base substrate 210. The orthographic projection of the edge of the third functional layer 233 on the base substrate 210 is within the orthographic projection of the edge of the second functional layer 232 on the base substrate 210, and the area of the orthographic projection of the third functional layer 233 on the base substrate 210 is smaller than the area of the orthographic projection of the second functional layer 232 on the base substrate 210. Thus, the edge of the first functional layer 231, the edge of the second functional layer 232, and the edge of the third functional layer 233 are arranged in a misaligned manner, so that the portions, which cover the side surface of the first functional layer 231, the side surface of the second functional layer 232, and the side surface of the third functional layer 233, of the second electrode 240 all have components extending laterally along the surface of the base substrate 210.

For example, as illustrated in FIG. 3A, the surface of the first functional layer 231 away from the base substrate 210 includes a portion covered by the second functional layer 232, and the portion of the surface of the first functional layer 231 away from the base substrate 210 except for the portion covered by the second functional layer 232 is in contact with the second electrode 240. The surface of the second functional layer 232 away from the base substrate 210 includes a portion covered by the third functional layer 233, and the portion of the surface of the second functional layer 232 away from the base substrate 210 except for the portion covered by the third functional layer 233 is in contact with the second electrode 240. Therefore, the drop of the portions, which cover and are in contact with the side surface of the first functional layer 231, the side surface of the second functional layer 232, and the side surface of the third functional layer 233, of the second electrode 240 in the direction perpendicular to the surface of the base substrate 210 can be reduced.

Figure 3B:
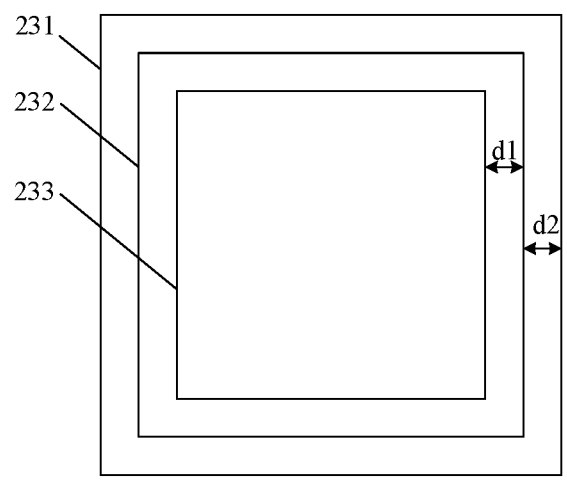
FIG. 3B is a schematic diagram of a planar structure of a light-emitting functional layer of the display substrate illustrated in FIG. 3A.

FIG. 3B is a schematic diagram of a planar structure of a light-emitting functional layer of the display substrate illustrated in FIG. 3A.

For example, as illustrated in FIG. 3A and FIG. 3B, the outline of the orthographic projection of the first functional layer 231 on the base substrate 210, the outline of the orthographic projection of the second functional layer 232 on the base substrate 210, and the outline of the orthographic projection of the third functional layer 233 on the base substrate 210 are substantially the same. That is, the outline of the first functional layer 231, the outline of the second functional layer 232, and the outline of the third functional layer 233 may be substantially the same, and for example, may be square or other suitable shapes.

For example, the center of the orthographic projection of the first functional layer 231 on the base substrate 210, the center of the orthographic projection of the second functional layer 232 on the base substrate 210, and the center of the orthographic projection of the third functional layer 233 on the base substrate 210 substantially coincide, so that in the case where the outline of the first functional layer 231, the outline of the second functional layer 232, and the outline of the third functional layer 233 are approximately the same, the distances d2 between the edge of the first functional layer 231 and the edge of the second functional layer 232 at different positions may be substantially the same, and the distances d1 between the edge of the second functional layer 232 and the edge of the third functional layer 233 at different positions may be substantially the same.

For example, in some embodiments of the present disclosure, the distance d2 between the edge of the first functional layer 231 and the edge of the second functional layer 232 may be the same with the distance d1 between the edge of the second functional layer 232 and the edge of the third functional layer 233, so that the portion, covering the side surface of the light-emitting functional layer 230, of the second electrode 240 may be further optimized, and the manufacturing process of the display substrate 20 may also be improved.

It should be noted that, in some other embodiments of the present disclosure, the distance d2 between the edge of the first functional layer 231 and the edge of the second functional layer 232 may also be different from the distance d1 between the edge of the second functional layer 232 and the edge of the third functional layer 233, and the embodiments of the present disclosure are not limited thereto.

It should be noted that, in the embodiments of the present disclosure, the specific distances among the edge of the first functional layer 231, the edge of the second functional layer 232, and the edge of the third functional layer 233 may be set according to the specific structure of the display substrate 20 or different actual needs, and the embodiments of the present disclosure are not limited thereto.

For example, as illustrated in FIG. 3A, the edge portion of the second functional layer 232 is in direct contact with the first functional layer 231, and the edge portion of the third functional layer 233 is in direct contact with the second functional layer 232. That is, no film layer or structure is provided between the edge portion of the second functional layer 232 and the first functional layer 231, and no film layer or structure is provided between the edge portion of the third functional layer 233 and the second functional layer 232.

For example, as illustrated in FIG. 3A, the surface of the first functional layer 231 away from the base substrate 210 includes a portion in contact with the second functional layer 232 and a portion in contact with the second electrode 240. The side surface of the first functional layer 231, the portion, which is in contact with the second electrode 240, of the surface of the first functional layer 231 away from the base substrate 210, and the side surface of the second functional layer 232 are in contact with each other and form a first step structure 261 on the at least one side surface of the light-emitting functional layer 230, and the second electrode 240 covers the first step structure 261 and is in contact with the first step structure 261. The surface of the second functional layer 232 away from the base substrate 210 includes a portion in contact with the third functional layer 233 and a portion in contact with the second electrode 240. The side surface of the second functional layer 232, the portion, which is in contact with the second electrode 240, of the surface of the second functional layer 232 away from the base substrate 210, and the side surface of the third functional layer 233 are in contact with each other and form a second step structure 262 on the at least one side surface of the light-emitting functional layer 230, and the second electrode 240 covers the second step structure 262 and is in contact with the second step structure 262.

For example, the shapes, the sizes, and the like of the first step structure 261 and the second step structure 262 may be adjusted correspondingly according to the sizes, the position relationship, and the like of the first functional layer 231, the second functional layer 232, and the third functional layer 233, and the embodiments of the present disclosure do not limit this.

For example, as illustrated in FIG. 3, the portions, which cover and are in contact with the first step structure 261 and the second step structure 262, of the second electrode 240 have a first ladder structure on the at least one side surface of the light-emitting functional layer 230, so that the portions, which cover and are in contact with the side surface of the first functional layer 231, the side surface of the second functional layer 232, and the side surface of the third functional layer 233, of the second electrode 240 have a continuous ladder shape. Therefore, the drop of the portions, which cover and are in contact with the side surface of the first functional layer 231, the side surface of the second functional layer 232, and the side surface of the third functional layer 233, of the second electrode 240 in the direction perpendicular to the surface of the base substrate 210 may be reduced, that is, the drop of the second electrode 240 at the edge of the film layer of the light-emitting element 250 may be reduced, thereby reducing or avoiding the phenomenon of the second electrode 240 being disconnected at the edge of the film layer of the light-emitting element 250 and allowing the electrical connection of the second electrode 240 to be significantly improved.

For example, in some embodiments of the present disclosure illustrated in FIG. 3A, the first functional layer 231, the second functional layer 232, and the third functional layer 233 may be a hole injection layer, a hole transport layer, and a light-emitting layer, respectively; alternatively, the first functional layer 231, the second functional layer 232, and the third functional layer 233 may be a light-emitting layer, an electron transport layer, and an electron injection layer, respectively; or, the second functional layer 232 is a light-emitting layer, the first functional layer 231 is one of a hole injection layer and a hole transport layer, and the third functional layer 233 is one of an electron transport layer and an electron injection layer. The embodiments of the present disclosure are not limited thereto.

For example, the materials and manufacturing processes of the first electrode 220, the second electrode 240, the first functional layer 231, the second functional layer 232, and the third functional layer 233 may be with reference to the descriptions of the corresponding parts of the display substrate 10 in the above embodiments, and details are not described herein again.

For example, as illustrated in FIG. 3A, the display substrate 20 further includes an auxiliary electrode 270. The structure and function of the auxiliary electrode 270 may be with reference to the auxiliary electrode 170 in the display substrate 10 illustrated in FIG. 1A, and details are not described herein again.

Figure 4:
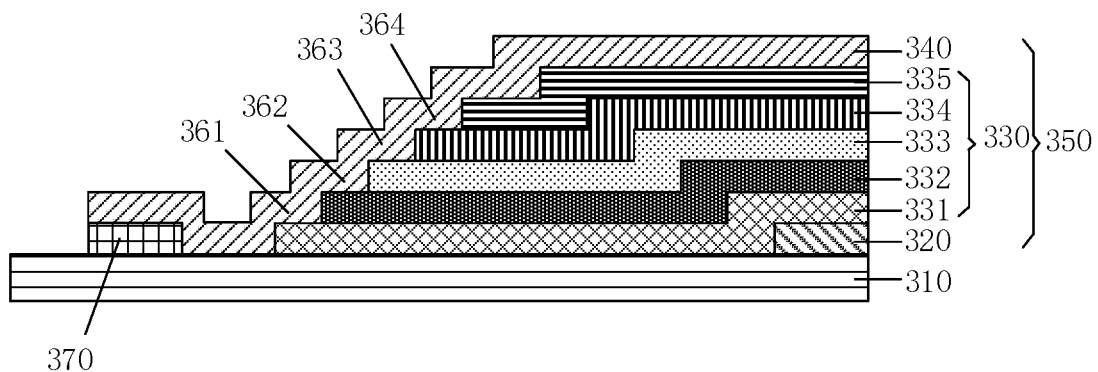
FIG. 4 is a schematic diagram of a partial cross-sectional structure of still another display substrate provided by some embodiments of the present disclosure.

FIG. 4 is a schematic diagram of a partial cross-sectional structure of still another display substrate provided by some embodiments of the present disclosure, and for example, is a schematic diagram of a structure at an edge of a film layer of a light-emitting element of the display substrate. For example, as illustrated in FIG. 4, the display substrate 30 includes a base substrate 310, a first electrode 320, a light-emitting functional layer 330, and a second electrode 340. The first electrode 320 is located on the base substrate 310, the light-emitting functional layer 330 is located on a side of the first electrode 320 away from the base substrate 310, and the second electrode 340 is located on a side of the light-emitting functional layer 330 away from the first electrode 320. The first electrode 320, the light-emitting functional layer 330, and the second electrode 340 constitute a light-emitting element 350, and the second electrode 340 further covers at least one side surface of the light-emitting functional layer 330 and a portion of a surface of the light-emitting functional layer 330 away from the base substrate 310.

For example, as illustrated in FIG. 4, the light-emitting functional layer 330 includes a first functional layer 331, a second functional layer 332 located on a side of the first functional layer 331 away from the base substrate 310, a third functional layer 333 located on a side of the second functional layer 332 away from the base substrate 310, a fourth functional layer 334 located on a side of the third functional layer 333 away from the base substrate 310, and a fifth functional layer 335 located on a side of the fourth functional layer 334 away from the base substrate 310. The first functional layer 331 is in direct contact with the second functional layer 332, the second functional layer 332 is in direct contact with the third functional layer 333, the third functional layer 333 is in direct contact with the fourth functional layer 334, and the fourth functional layer 334 is in direct contact with the fifth functional layer 335.

For example, the first functional layer 331 covers at least one side surface of the first electrode 320 and a portion of the surface of the base substrate 310. The orthographic projection of the edge of the second functional layer 332 on the base substrate 310 is within the orthographic projection of the edge of the first functional layer 331 on the base substrate 310, and the area of the orthographic projection of the second functional layer 332 on the base substrate 310 is smaller than the area of the orthographic projection of the first functional layer 331 on the base substrate 310. The orthographic projection of the edge of the third functional layer 333 on the base substrate 310 is within the orthographic projection of the edge of the second functional layer 332 on the base substrate 310, and the area of the orthographic projection of the third functional layer 333 on the base substrate 310 is smaller than the area of the orthographic projection of the second functional layer 332 on the base substrate 310. The orthographic projection of the edge of the fourth functional layer 334 on the base substrate 310 is within the orthographic projection of the edge of the third functional layer 333 on the base substrate 310, and the area of the orthographic projection of the fourth functional layer 334 on the base substrate 310 is smaller than the area of the orthographic projection of the third functional layer 333 on the base substrate 310. The orthographic projection of the edge of the fifth functional layer 335 on the base substrate 310 is within the orthographic projection of the edge of the fourth functional layer 334 on the base substrate 310, and the area of the orthographic projection of the fifth functional layer 335 on the base substrate 310 is smaller than the area of the orthographic projection of the fourth functional layer 334 on the base substrate 310.

Thus, the edge of the first functional layer 331, the edge of the second functional layer 332, the edge of the third functional layer 333, the edge of the fourth functional layer 334, and the edge of the fifth functional layer 335 are arranged in a misaligned manner, so that the portions, which cover the side surface of the first functional layer 331, the side surface of the second functional layer 332, the side surface of the third functional layer 333, the side surface of the fourth functional layer 334, and the side surface of the fifth functional layer 335, of the second electrode 340 have the component extending laterally along the surface of the base substrate 310.

For example, as illustrated in FIG. 4, a portion of the surface of the first functional layer 331 away from the base substrate 310 except for the portion covered by the second functional layer 332 is in contact with the second electrode 340, a portion of the surface of the second functional layer 332 away from the base substrate 310 except for the portion covered by the third functional layer 333 is in contact with the second electrode 340, a portion of the surface of the third functional layer 333 away from the base substrate 310 except for the portion covered by the fourth functional layer 334 is in contact with the second electrode 340, and a portion of the surface of the fourth functional layer 334 away from the base substrate 310 except for the portion covered by the fifth functional layer 335 is in contact with the second electrode 340. Thus, the drops of the portions, which cover and are in contact with the side surface of the first functional layer 331, the side surface of the second functional layer 332, the side surface of the third functional layer 333, the side surface of the fourth functional layer 334, and the side surface of the fifth functional layer 335, of the second electrode 340 in the direction perpendicular to the surface of the base substrate 310 may be reduced.

It should be noted that, in the embodiments of the present disclosure, the specific distances among the edge of the first functional layer 331, the edge of the second functional layer 332, the edge of the third functional layer 333, the edge of the fourth functional layer 334, and the edge of the fifth functional layer 335 may be set according to the specific structure of the display substrate 30 or different actual requirements, and the embodiments of the present disclosure are not limited thereto.

For example, the distances among the edge of the first functional layer 331, the edge of the second functional layer 332, the edge of the third functional layer 333, the edge of the fourth functional layer 334, and the edge of the fifth functional layer 335 may be set with reference to the structure of the display substrate 20 illustrated in FIG. 3A and FIG. 3B, and details are not described herein again.

For example, as illustrated in FIG. 4, the edge portion of the second functional layer 332 is in direct contact with the first functional layer 331, the edge portion of the third functional layer 333 is in direct contact with the second functional layer 332, the edge portion of the fourth functional layer 334 is in direct contact with the third functional layer 333, and the edge portion of the fifth functional layer 335 is in direct contact with the fourth functional layer 334. That is, no film layer or structure is provided between the edge portion of the second functional layer 332 and the first functional layer 331, no film layer or structure is provided between the edge portion of the third functional layer 333 and the second functional layer 332, no film layer or structure is provided between the edge portion of the fourth functional layer 334 and the third functional layer 333, and no film layer or structure is provided between the edge portion of the fifth functional layer 335 and the fourth functional layer 334.

For example, as illustrated in FIG. 4, the surface of the first functional layer 331 away from the base substrate 310 includes a portion in contact with the second functional layer 332 and a portion in contact with the second electrode 340. The side surface of the first functional layer 331, the portion, which is in contact with the second electrode 340, of the surface of the first functional layer 331 away from the base substrate 310, and the side surface of the second functional layer 332 are in contact with each other and form a first step structure 361 on the at least one side surface of the light-emitting functional layer 330, and the second electrode 340 covers the first step structure 361 and is in contact with the first step structure 361. The surface of the second functional layer 332 away from the base substrate 310 includes a portion in contact with the third functional layer 333 and a portion in contact with the second electrode 340. The side surface of the second functional layer 332, the portion, which is in contact with the second electrode 340, of the surface of the second functional layer 332 away from the base substrate 310, and the side surface of the third functional layer 333 are in contact with each other and form a second step structure 362 on the at least one side surface of the light-emitting functional layer 330, and the second electrode 340 covers the second step structure 362 and is in contact with the second step structure 362. The surface of the third functional layer 333 away from the base substrate 310 includes a portion in contact with the fourth functional layer 334 and a portion in contact with the second electrode 340. The side surface of the third functional layer 333, the portion, which is in contact with the second electrode 340, of the surface of the third functional layer 333 away from the base substrate 310, and the side surface of the fourth functional layer 334 are in contact with each other and form a third step structure 363 on the at least one side surface of the light-emitting functional layer 330, and the second electrode 340 covers the third step structure 363 and is in contact with the third step structure 363. The surface of the fourth functional layer 334 away from the base substrate 310 includes a portion in contact with the fifth functional layer 335 and a portion in contact with the second electrode 340. The side surface of the fourth functional layer 334, the portion, which is in contact with the second electrode 340, of the surface of the fourth functional layer 334 away from the base substrate 310, and the side surface of the fifth functional layer 335 are in contact with each other and form a fourth step structure 364 on the at least one side surface of the light-emitting functional layer 330, and the second electrode 340 covers the fourth step structure 364 and is in contact with the fourth step structure 364.

For example, the shapes, the sizes, and the like of the first step structure 361, the second step structure 362, the third step structure 363, and the fourth step structure 364 may be adjusted correspondingly according to the sizes, the position relationship, and the like of the first functional layer 331, the second functional layer 332, the third functional layer 333, the fourth functional layer 334, and the fifth functional layer 335, and the embodiments of the present disclosure are not limited in this aspect.

For example, as illustrated in FIG. 4, the portions, which cover and are in contact with the first step structure 361 and the second step structure 362, of the second electrode 340 have a first ladder structure on the at least one side surface of the light-emitting functional layer 330. The portions, which cover and are in contact with the second step structure 362 and the third step structure 363, of the second electrode 340 have a second ladder structure on the at least one side surface of the light-emitting functional layer 330. The portions, which cover and are in contact with the third step structure 363 and the fourth step structure 364, of the second electrode 340 have a third ladder structure on the at least one side surface of the light-emitting functional layer 330. Thus, the portions, which cover the side surface of the first functional layer 331, the side surface of the second functional layer 332, the side surface of the third functional layer 333, the side surface of the fourth functional layer 334, and the side surface of the fifth functional layer 335, of the second electrode 340 have a continuous ladder shape, so that the drop of the portions, which cover the side surface of the first functional layer 331, the side surface of the second functional layer 332, the side surface of the third functional layer 333, the side surface of the fourth functional layer 334, and the side surface of the fifth functional layer 335, of the second electrode 340 in the direction perpendicular to the surface of the base substrate 310 may be reduced, that is, the drop of the second electrode 340 at the edge of the film layer of the light-emitting element 350 may be reduced, thereby reducing or avoiding the phenomenon of the second electrode 340 being disconnected at the edge of the film layer of the light-emitting element 350 and allowing the electrical connection of the second electrode 340 to be significantly improved.

For example, in some embodiments of the present disclosure illustrated in FIG. 4, the first functional layer 331 is a hole injection layer, the second functional layer 332 is a hole transport layer, the third functional layer 333 is a light-emitting layer, the fourth functional layer 334 is an electron transport layer, and the fifth functional layer 335 is an electron injection layer.

For example, the materials and manufacturing processes of the first electrode 320, the second electrode 340, the first functional layer 331, the second functional layer 332, the third functional layer 333, the fourth functional layer 334, and the fifth functional layer 335 may be with reference to the descriptions of the corresponding part of the display substrate 10 in the above embodiments, and details are not described herein again.

For example, as illustrated in FIG. 4, the display substrate 30 further includes an auxiliary electrode 370. The structure and function of the auxiliary electrode 370 may be with reference to the auxiliary electrode 170 in the display substrate 10 illustrated in FIG. 1A or the auxiliary electrode 270 in the display substrate 20 illustrated in FIG. 3A, and details are not described herein again.

It should be noted that, in some other embodiments of the present disclosure, the light-emitting functional layer of the display substrate may further include four, six, or more functional layers, and the embodiments of the present disclosure are not limited thereto. The structures, arrangements, and functions of functional layers may be with reference to the corresponding descriptions of the display substrate 10, the display substrate 20, and the display substrate 30 in the above embodiments, and details are not described herein again.

For example, in the display substrate 10, the display substrate 20, and the display substrate 30 provided by the embodiments of the present disclosure described above, the edges of all the functional layers in the light-emitting functional layer are not aligned, so that the edges of adjacent functional layers may form a step structure, and therefore, the drop of the portion, covering the side surface of the light-emitting functional layer, of the second electrode in the direction perpendicular to the surface of the base substrate may be reduced as much as possible.

In some other embodiments of the present disclosure, a step structure may also be formed by three or more functional layers, that is, a step structure may also include adjacent functional layers with edges arranged in alignment. For example, the drop of the step structure in the direction perpendicular to the surface of the base substrate needs to be no greater than the height of any functional layer in the display substrate in the direction perpendicular to the surface of the base substrate, and for example, a range of the drop of the step structure in the direction perpendicular to the surface of the base substrate may be no greater than 90 nm, and for example, may further be 10 nm to 80 nm. For example, in the case where the drop of the step structure in the direction perpendicular to the surface of the base substrate is higher than the above range, the portion, covering the side surface of the light-emitting functional layer, of the second electrode may still have a relatively large drop in the direction perpendicular to the surface of the base substrate, so that it is difficult to effectively prevent the second electrode from being disconnected at the edge of the film layer of the light-emitting element; and in the case where the drop of the step structure in the direction perpendicular to the surface of the base substrate is lower than the above range, the difficulty of manufacturing the display substrate may be increased, which may further affect the yield of the display substrate.

For example, in some embodiments of the present disclosure, it is not necessary to provide other structures or components between the auxiliary electrode and the light-emitting functional layer, for example, the auxiliary electrode may be in contact with the side surface of the first functional layer, and thus, the size of the peripheral region of the display substrate may be reduced, which may facilitate the narrow frame design of a display panel or display device including the display substrate.

Hereinafter, the case where the auxiliary electrode is in contact with the side surface of the first functional layer is described based on the display substrate 30 illustrated in FIG. 4.

Figure 5:
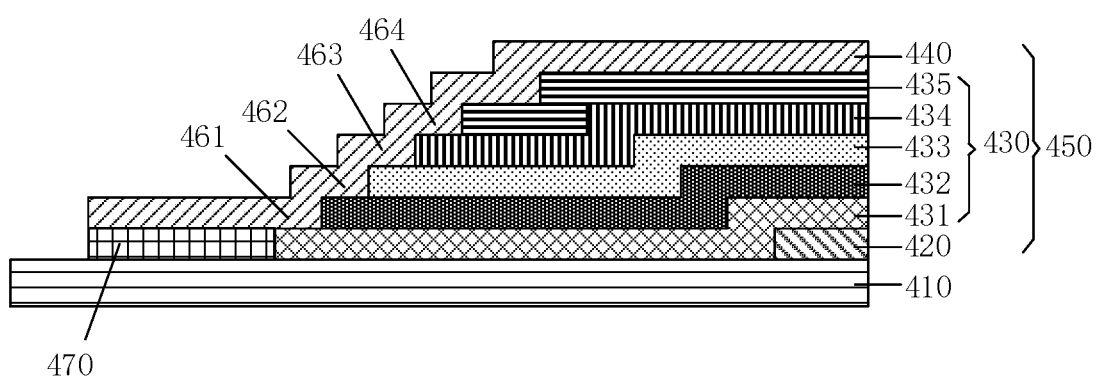
FIG. 5 is a schematic diagram of a partial cross-sectional structure of further still another display substrate provided by some embodiments of the present disclosure.

FIG. 5 is a schematic diagram of a partial cross-sectional structure of further still another display substrate provided by some embodiments of the present disclosure, and for example, is a schematic diagram of a structure at an edge of a film layer of a light-emitting element of the display substrate. It should be noted that, in the display substrate 40 illustrated in FIG. 5, except for the position relationship of the auxiliary electrode 470 and the first functional layer 431, other structures of the display substrate 40 are basically the same as those of the display substrate 30 illustrated in FIG. 4, and details are not described herein again.

For example, as illustrated in FIG. 5, the auxiliary electrode 470 is in contact with the side surface of the first functional layer 431, and the first step structure 461 may include a portion, which is in contact with the second electrode 440, of the surface of the first functional layer 431 away from the base substrate 410, and the side surface of the second functional layer 432. Thus, in the case where the drop of the second electrode 440 at the edge of the film layer of the light-emitting element 450 is reduced, the size of the peripheral region of the display substrate 40 may also be reduced, thereby facilitating the narrow frame design of the display panel or display device including the display substrate 40.

For example, in some embodiments of the present disclosure, the display substrate may be an organic light-emitting diode display substrate or a quantum dot light-emitting diode display substrate. For example, the display substrate 10, the display substrate 20, the display substrate 30, and the display substrate 40 in the above embodiments may all be organic light-emitting diode display substrates or quantum dot light-emitting diode display substrates. Alternatively, the display substrate 10, the display substrate 20, the display substrate 30, and the display substrate 40 may also be other types of substrates with display functions, and the embodiments of the present disclosure do not limit this.

For example, in some embodiments of the present disclosure, the base substrate of the display substrate is a silicon substrate, and the silicon substrate includes a pixel driving circuit. The pixel driving circuit is configured to be electrically connected to the first electrode and provide a first electrode driving current to the first electrode.

For example, in some embodiments of the present disclosure, the peripheral region of the display substrate includes a connection electrode region and a sensor region, the connection electrode region is at least partially around the sensor region, and the sensor region is at least partially around the display region. The auxiliary electrode is located in the connection electrode region, and the orthographic projection of the sensor region on the base substrate is located in the orthographic projection of any one of functional layers in the light-emitting functional layer on the base substrate.

For example, in some embodiments of the present disclosure, the peripheral region further includes a first dummy sub-region and a second dummy sub-region, the connection electrode region is at least partially around the first dummy sub-region, and the first dummy sub-region is at least partially around the sensor region. The sensor region is at least partially around the second dummy sub-region, and the second dummy sub-region is at least partially around the display region. The light-emitting functional layer is located in the display region, the second dummy sub-region, the sensor region, and the first dummy sub-region.

Figure 6A:
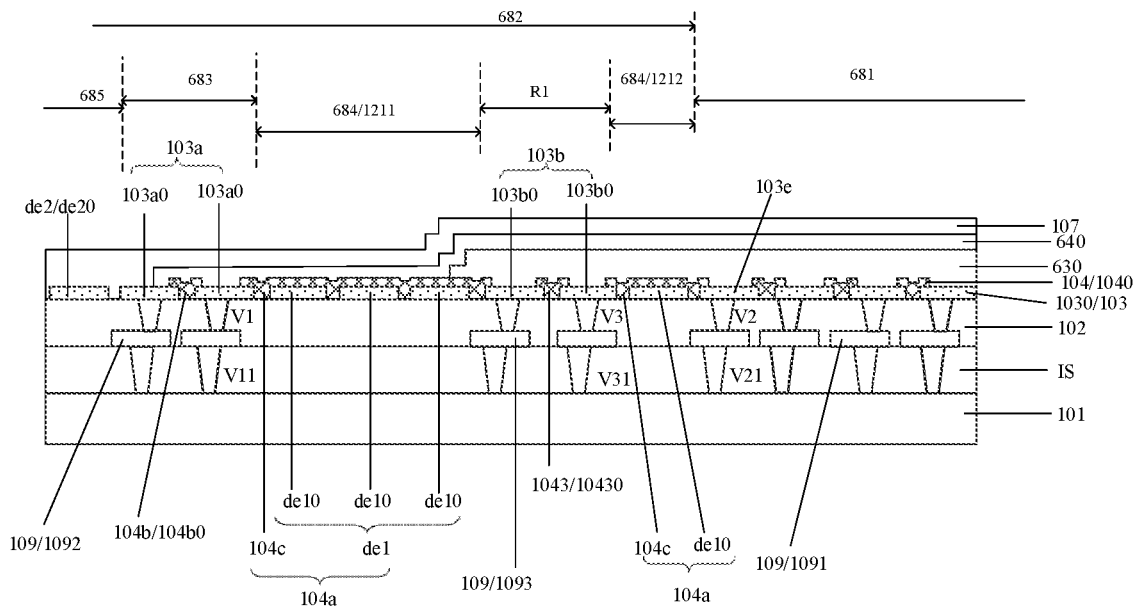
FIG. 6A is a schematic diagram of a partial cross-sectional structure of further still another display substrate provided by some embodiments of the present disclosure.
Figure 6B:
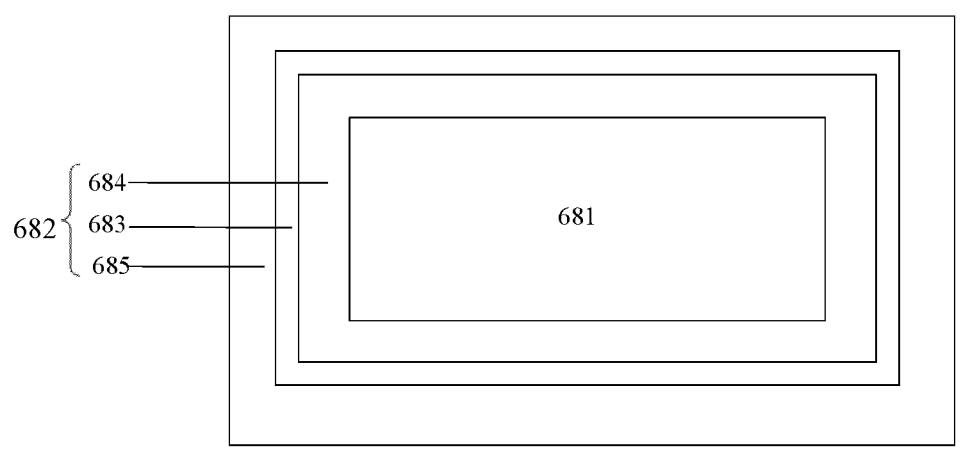
FIG. 6B is a schematic diagram illustrating region division of a display substrate provided by some embodiments of the present disclosure.

FIG. 6A is a schematic diagram of a partial cross-sectional structure of further still another display substrate provided by some embodiments of the present disclosure, and FIG. 6B is a schematic diagram illustrating region division of a display substrate provided by some embodiments of the present disclosure.

The region division of the display substrate 60 and the structures in the regions are described below with reference to the display substrate 60 illustrated in FIG. 6A and FIG. 6B.

For example, in addition to illustrating the structure of the display substrate 60 in more detail and illustrating the region division in the peripheral region 682, the structures at the edge of the film layer of the light-emitting element of the display substrate 60 in FIG. 6A, for example, the structures of the second electrode 640 and the light-emitting functional layer 630 illustrated in FIG. 6A, may be substantially the same as those of the display substrate 10 (or the display substrate 20, the display substrate 30) in the above embodiments. Certainly, the display substrate 60 illustrated in FIG. 6A may also be different from the display substrates in the above embodiments, as long as the corresponding functions can be achieved.

It should be understood that the detailed structure of the light-emitting functional layer 630 of the display substrate 60 is not illustrated in FIG. 6A for the sake of concise description. The specific structure of the light-emitting functional layer 630 of the display substrate 60 may be with reference to the specific structure of the light-emitting functional layer 130 of the display substrate 10 illustrated in FIG. 1A (or the light-emitting functional layer 230 of the display substrate 20 illustrated in FIG. 3A, the light-emitting functional layer 330 of the display substrate 30 illustrated in FIG. 4), and details are not described herein again.

For example, as illustrated in FIG. 6B, the display substrate 60 includes a display region 681 and a peripheral region 682, and the peripheral region 682 includes three regions: a connection electrode region 683, a first dummy region 684, and a second dummy region 685. The first dummy region 684 is located between the connection electrode region 683 and the display region 681, and the second dummy region 685 is located on a side of the connection electrode region 683 away from the display region 681, that is, the second dummy region 685 is located on a side of the connection electrode region 683 away from the first dummy region 684.

For example, as illustrated in FIG. 6A, the display substrate 60 includes: a first electrode pattern 103, located in the display region 681 of the display substrate 60 and including a plurality of first electrodes 1030 (e.g., anodes) spaced apart from each other; a connection electrode pattern 103a, located in the connection electrode region 683 of the display substrate 60 and including a plurality of connection electrodes 103a0 (i.e., auxiliary electrodes); and a first dummy electrode pattern de1, located in the first dummy region 684 of the display substrate 60 and including a plurality of first dummy electrodes de10.

For example, as illustrated in FIG. 6A and FIG. 6B, the connection electrode region 683 is around the display region 681, and the first dummy region 684 is located between the connection electrode region 683 and the display region 681. The connection electrode pattern 103a is around the first electrode pattern 103, and the first dummy electrode pattern de1 is around the first electrode pattern 103. The first dummy electrode pattern de1 is located between the connection electrode pattern 103a and the first electrode pattern 103.

For example, as illustrated in FIG. 6A, the display substrate 60 further includes a second electrode 640 (for example, a cathode), and the second electrode 640 is connected to the connection electrode 103a0. The peripheral region 682 of the display substrate 60 is around the display region 681, and the peripheral region 682 includes the connection electrode region 683 and the first dummy region 684. The second electrode 640 is located in the display region 681 and the peripheral region 682, and the second electrode 640 and the first electrode pattern 103 are spaced apart from each other.

For example, in the connection electrode region 683 of the display substrate 60, the orthographic projection (not shown) of the color filter layer on the base substrate 101 completely covers orthographic projections of the plurality of connection electrodes 103a0 on the base substrate 101.

For example, the orthographic projection of the first electrode pattern 103 on the base substrate 101 and the orthographic projection of the second electrode 640 on the base substrate 101 are within the orthographic projection of the color filter layer (not shown) on the base substrate 101.

For example, the orthographic projection of the light-emitting functional layer 630 on the base substrate 101 is within the orthographic projection of the color filter layer (not shown) on the base substrate 101.

For example, the pattern density of the first electrode pattern 103, the pattern density of the connection electrode pattern 103a, and the pattern density of the first dummy electrode pattern de1 are the same, and the shape of the first electrode 1030 of the first electrode pattern 103, the shape of the connection electrode 103a0 of the connection electrode pattern 103a, and the shape of the first dummy electrode de10 of the first dummy electrode pattern de1 are the same, so that the consumption rates of the etching solution or the developing solution in respective regions during etching or development process may be approximately the same, so as to ensure the uniformity of the process.

For example, as illustrated in FIG. 6A, the peripheral region 681 further includes a sensor region R1, the connection electrode region 683 is at least partially around the sensor region R1, and the sensor region R1 is at least partially around the display region 681. The orthographic projection of the sensor region R1 on the base substrate 101 is located within the orthographic projection of any one of functional layers in the light-emitting functional layer 630 on the base substrate 101.

For example, as illustrated in FIG. 6A, the display substrate 60 further includes a sensor electrode pattern 103b, and the sensor electrode pattern 103b is located in the sensor region R1 of the display substrate 60 and includes a plurality of sensor electrodes 103b0. For example, the pattern density of the sensor electrode pattern 103b and the pattern density of the first electrode pattern 103 are the same, and the pattern shape of the sensor electrode 103b0 and the pattern shape of the first electrode pattern 103 are the same.

For example, as illustrated in FIG. 6A, the first dummy region 684 of the peripheral region 681 further includes a first dummy sub-region 1211 and a second dummy sub-region 1212. The connection electrode region 683 is at least partially around the first dummy sub-region 1211, and the first dummy sub-region 1211 is at least partially around the sensor region R1. The sensor region R1 is at least partially around the second dummy sub-region 1212, and the second dummy sub-region 1212 is at least partially around the display region 681. The light-emitting functional layer 630 is located in the display region 681, the second dummy sub-region 1212, the sensor region R1, and the first dummy sub-region 1211.

It should be noted that the pixel structure of the sensor region R1 is the same as the pixel structure of the display region 681. In the sensor region R1, the sensor electrode 103b0 is electrically connected to the pixel driving circuit through the tungsten via hole V3 and the via hole V31. The pixel structure of the sensor region R1 is different from the pixel structure of the first dummy sub-region 1211, the pixel structure of the second dummy sub-region 1212, and the pixel structure of the second dummy region 685. The first dummy electrode pattern de1 of the first dummy sub-region 1211, the first dummy electrode de10 of the second dummy sub-region 1212, and the second dummy electrode pattern de2 of the second dummy region 685 are not connected to other circuits through via holes.

For example, the pixel structure of the sensor region R1 is used to sense the voltage of the first electrode 1030 of the display region 681 and is used to implement circuit compensation. For example, the voltage of the first electrode 1030 of the display region 681 may be sensed through a compensation transistor connected to a temperature sensor.

For example, as illustrated in FIG. 6A, the second dummy sub-region 1212 in the first dummy region 684 is used to isolate the sensor region R1 and the display region 681. The first dummy sub-region 1211 in the first dummy region 684 is used for transition, so that the second electrode 640 and the connection electrode 103a0 in the connection electrode region 683 are better overlapped.

For example, as illustrated in FIG. 6A, the display substrate 60 further includes a second dummy electrode pattern de2, and the second dummy electrode pattern de2 is located in the second dummy region 685 of the display substrate 60 and includes a plurality of second dummy electrodes de20. The second dummy region 685 is located on a side of the connection electrode region 683 away from the display region 681. For example, the pattern density of the second dummy electrode pattern de2 and the pattern density of the first electrode pattern 103 are the same, and the second dummy electrode pattern de2 and the first electrode pattern 103 are separated by a pixel defining layer.

For example, the dummy pixels in the first dummy sub-region 1211 of the first dummy region 684 are arranged in two rows, and the dummy pixels in the second dummy region 685 are arranged in two rows. For example, the dummy pixels are arranged in two rows in the row direction, and the dummy pixels are arranged in two columns in the column direction.

For example, as illustrated in FIG. 6A, the second dummy sub-region 1212 is located between the sensor region R1 and the display region 681. The portion of the first dummy region 684 between the sensor region R1 and the connection electrode region 683 is the first dummy sub-region 1211. A first filling layer 104a is formed in the first dummy sub-region 1211, the first filling layer 104a includes a plurality of first dummy electrodes de10 and an insulating cladding layer 104c, the first electrode pattern 103 includes an edge first electrode 103e adjacent to the connection electrode 103a0, and the insulating cladding layer 104c is in contact with the connection electrode 103a0 and the edge first electrode 103e, respectively. For example, the material of the insulating cladding layer 104c is the same as the material of the pixel defining layer.

For example, as illustrated in FIG. 6A, the second electrode 640 is in contact with the insulating cladding layer 104c.

For example, as illustrated in FIG. 6A, a first thin film encapsulation layer 107 is further provided on the side of the second electrode 640 away from the base substrate 101, and the first thin film encapsulation layer 107 can prevent water and oxygen from entering the light-emitting functional layer 630.

For example, as illustrated in FIG. 6A, the edge first electrode 103e is insulated from the plurality of first dummy electrodes de10.

For example, as illustrated in FIG. 6A, the display substrate 60 further includes a pixel defining layer 104, the pixel defining layer 104 includes a plurality of pixel defining portions 1040, and each of the plurality of pixel defining portions 1040 is located between adjacent first electrodes 1030.

For example, as illustrated in FIG. 6A, the insulating cladding layer 104c and the pixel defining layer 104 are located in the same layer, and may be formed by using the same patterning process on the same film layer to simplify the manufacturing process.

For example, as illustrated in FIG. 6A, the first electrode pattern 103 and the connection electrode pattern 103a are located in the same layer, and may be formed by using the same patterning process on the same film layer to simplify the manufacturing process.

For example, as illustrated in FIG. 6A, the display substrate 60 further includes a second filling layer 104b, the second filling layer 104b includes at least one second filling portion 104b0, and the second filling portion 104b0 is located between adjacent connection electrodes 103a0. For example, the second filling layer 104b is an insulating layer. For example, as illustrated in FIG. 6A, the second filling portion 104b0 is in contact with the adjacent connection electrodes 103a0, respectively.

For example, as illustrated in FIG. 6A, the second filling layer 104b and the first filling layer 104a are located in the same layer, and may be formed by using the same patterning process on the same film layer to simplify the manufacturing process.

For example, as illustrated in FIG. 6A, the display substrate 60 further includes a third filling layer 1043, the third filling layer 1043 includes a plurality of third filling portions 10430, and the third filling portion 10430 is located between adjacent sensor electrodes 103b0 or between the sensor electrode 103b0 and the adjacent first dummy electrode. FIG. 6A takes the third filling portion 10430 between adjacent sensor electrodes 103b0 as an example.

For example, as illustrated in FIG. 6A, the third filling layer 1043 and the pixel defining layer 104 are located in the same layer, and may be formed by using the same patterning process on the same film layer to simplify the manufacturing process.

For example, as illustrated in FIG. 6A, the display substrate 60 further includes a light-emitting functional layer 630, the light-emitting functional layer 630 is located between the first electrode pattern 103 and the second electrode 640, and the light-emitting functional layer 630 is in contact with the first filling layer 104a. For example, the light-emitting functional layer 630 is in contact with part of the first filling layer 104a. For example, in the display region 681, the color filter layer (not shown) covers the light-emitting functional layer 630.

For example, as illustrated in FIG. 6A, the light-emitting functional layer 630 is in contact with the sensor electrode pattern 103b. The light-emitting functional layer 630 is in contact with the first dummy electrode located in the second dummy sub-region 1212.

For example, as illustrated in FIG. 6A, an insulating layer IS is further provided on the base substrate 101, a conductive pattern 109 is provided on the insulating layer IS, and the conductive pattern 109 includes a first conductive portion 1091, a second conductive portion 1092, and a third conductive portion 1093. The insulating layer IS includes a via hole V11, a via hole V21, and a via hole V31. The via holes V11, V21, and V31 are filled with conductive materials to form connection components. The first electrode 1030 is connected to the connection component in the via hole V21 through the first conductive portion 1091. The connection electrode 103a0 is connected to the connection component in the via hole V11 through the second conductive portion 1092. The sensor electrode 103b0 is connected to the connection component in the via hole V31 through the third conductive portion 1093.

For example, the portion, which overlaps with the plurality of first dummy electrodes de10 in the direction perpendicular to the base substrate 101, of the first insulating layer 102 is not provided with via holes.

For example, the portion, which overlaps with the plurality of second dummy electrodes de20 in the direction perpendicular to the base substrate 101, of the first insulating layer 102 is not provided with via holes.

For example, the portion, which overlaps with the plurality of connection electrodes 103a0 in the direction perpendicular to the base substrate 101, of the first insulating layer 102 is provided with the via hole V1.

For example, the portion, which overlaps with the plurality of first electrodes 1030 in the direction perpendicular to the base substrate 101, of the first insulating layer 102 is provided with the via hole V2.

For example, the portion, which overlaps with the plurality of sensor electrodes 103b0 in the direction perpendicular to the base substrate 101, of the first insulating layer 102 is provided with the via hole V3.

Figure 7:
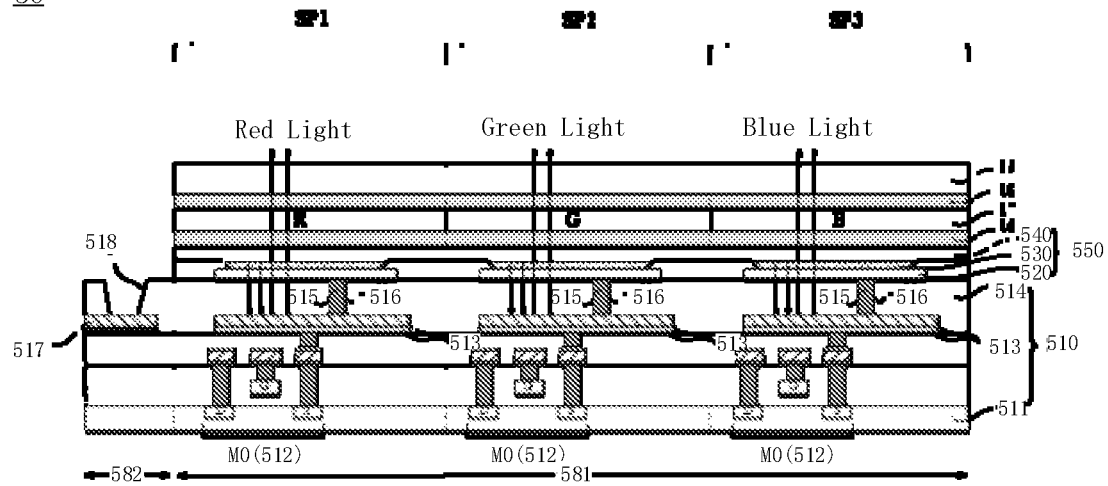
FIG. 7 is a schematic diagram of a partial cross-sectional structure of further still another display substrate provided by some embodiments of the present disclosure.

FIG. 7 is a schematic diagram of a partial cross-sectional structure of further still another display substrate provided by some embodiments of the present disclosure, and for example, may be a schematic diagram corresponding to a partial cross-sectional structure in the display region of the display substrate 10 (or the display substrate 20 illustrated in FIG. 3A, the display substrate 30 illustrated in FIG. 4, the display substrate 40 illustrated in FIG. 5, and the display substrate 60 illustrated in FIG. 6A) illustrated in FIG. 1A. In addition to illustrating the structure of the display substrate 50 in more detail and illustrating a plurality of sub-pixels in the display region, the structure at the edge of the film layer of the light-emitting element of the display substrate 50 in FIG. 7 may be substantially the same as that of the display substrate 10 (or the display substrate 20, the display substrate 30, the display substrate 40) in the above embodiments. It should be understood that the display substrate 50 illustrated in FIG. 7 may be completely the same as or substantially the same as the display substrate 10 (or the display substrate 20, the display substrate 30, the display substrate 40, the display substrate 60) in the above embodiments, and for example, for the sake of concise description, the detailed structure of the display region of the display substrate 10 is not illustrated in FIG. 1A. Certainly, the display substrate 50 illustrated in FIG. 7 may also be different from the display substrates in the above embodiments, as long as the corresponding functions can be achieved. It should be understood that the display substrate 10 illustrated in FIG. 1A (and the display substrate 20 illustrated in FIG. 3A, the display substrate 30 illustrated in FIG. 4, the display substrate 40 illustrated in FIG. 5, and the display substrate 60 illustrated in FIG. 6A) also includes a plurality of sub-pixels, and for the sake of concise description, the specific structure of the sub-pixel is not illustrated in FIG. 1A (and FIG. 3A, and FIG. 4 to FIG. 6A).

In the embodiments, as illustrated in FIG. 7, the display substrate 50 includes a base substrate 510 and a light-emitting element 550 (i.e., a display component), and the base substrate 510 is a silicon substrate. For example, the silicon substrate 510 includes a silicon-based substrate 511, a pixel driving circuit 512, a light reflection layer 513, and an insulating layer 514 which are sequentially stacked. The light-emitting element 550 includes a first electrode 520 (e.g., an anode), a light-emitting functional layer 530, and a second electrode 540 (e.g., a cathode) which are sequentially stacked on the insulating layer 514. The first electrode 520 is a transparent electrode layer. For example, the insulating layer 514 is transparent, so that light emitted by the light-emitting functional layer 530 may penetrate through the insulating layer 514 and reach the light reflection layer 513 to be reflected by the light reflection layer 513.

For example, the insulating layer 514 includes a via hole 516 filled with a metal component 515, and the light reflection layer 513 is electrically connected to the first electrode 520 through the metal component 515. In this way, a conductive path is formed between the light reflection layer 513 and the first electrode 520 in the insulating layer 514, which may facilitate transmitting the electrical signal (for example, the first electrode driving current) provided by the pixel driving circuit 512 in the silicon substrate 510 to the first electrode 520 through the light reflection layer 513. In this way, it is not only advantageous to achieve the control of the light-emitting element 550 by the pixel driving circuit 512, but also to enable the structure of the display substrate 50 to be more compact, which may facilitate miniaturization of the device. Further, for example, the metal component 515 is made of a metal material, such as the tungsten metal, and a via hole filled with the tungsten metal is also referred to as a tungsten via hole (W-via). For example, in the case where the thickness of the insulating layer 514 is relatively large, forming the tungsten via hole in the insulating layer 514 may ensure the stability of the conductive path, and because of the mature process of manufacturing the tungsten via hole, the obtained insulating layer 514 has a good surface flatness, which is beneficial to reduce the contact resistance between the insulating layer 514 and the first electrode 520. It can be understood that the tungsten via hole is not only suitable for achieving electrical connection between the insulating layer 514 and the first electrode 520, but also suitable for achieving electrical connection between the light reflection layer 513 and the pixel driving circuit 512, and electrical connection between other wiring layers, such as the layers where the electrodes of the driving transistor, the switching transistor and the capacitor in the pixel circuit and the signal lines are located.

For example, the silicon substrate 510 includes the pixel driving circuit 512, the pixel driving circuit 512 and the light reflection layer 513 are electrically connected to each other, and the pixel driving circuit 512 is used to drive the light-emitting element 550 to emit light. The pixel driving circuit 512 at least includes a driving transistor M0 and a switching transistor (not shown), and the driving transistor M0 is electrically connected to the light reflection layer 513. Thus, the electrical signal for driving the light-emitting element 550 may be transmitted to the first electrode 520 through the light reflection layer 513, thereby controlling the light-emitting element 550 to emit light.

For example, the driving transistor M0 includes a gate electrode G, a source electrode S, and a drain electrode D. The source electrode S of the driving transistor M0 is electrically connected to the light reflection layer 513. In the case where the driving transistor M0 is in a turn-on state, the electrical signal provided by the power supply line may be transmitted to the first electrode 520 through the source electrode S of the driving transistor M0 and the light reflection layer 513. Because a voltage difference is formed between the first electrode 520 and the second electrode 540, an electric field is formed between the first electrode 520 and the second electrode 540, and the light-emitting functional layer 530 emits light under the action of the electric field. It can be understood that in the driving transistor M0, the positions of the source electrode S and the drain electrode D are interchangeable, and therefore, as long as one selected from a group consisting of the source electrode S and the drain electrode D is electrically connected to the light reflection layer 513.

For example, the display substrate 50 includes a plurality of sub-pixels (or pixel units), and three sub-pixels, that is, a red sub-pixel SP1, a green sub-pixel SP2, and a blue sub-pixel SP3, are exemplarily illustrated in FIG. 7. Each sub-pixel corresponds to a sub-pixel region of the display substrate 50. That is, each sub-pixel is provided with an independent light-emitting element 550 and an independent driving transistor M0.

For example, the insulating layers 514 in the three sub-pixels are integrally formed to simplify the manufacturing process. For example, as illustrated in FIG. 7, the insulating layer 514 further includes an opening 518 exposing the pad 517, and the arrangement of the opening 518 facilitates electrical connection and signal communication between the pad 517 and external circuits. For example, the opening 518 exposing the pad 517 is located in the peripheral region 582 of the display substrate 50, and for example, may be located between the auxiliary electrode and the display region 581 of the display substrate 50. The colors of the sub-pixels in the display substrate 50 are only schematic, and may also include other colors such as yellow, white, etc.

For example, as illustrated in FIG. 7, the display substrate 50 further includes a second thin film encapsulation layer 16, a color filter layer 17, and a first thin film encapsulation layer 18 which are sequentially provided on the second electrode 540. The display substrate 50 further includes a cover plate 19, and the cover plate 19 is disposed on the first thin film encapsulation layer 18. For example, the second thin film encapsulation layer 16 is located on the side of the second electrode 540 away from the silicon-based substrate 511. The color filter layer 17 is located on the side of the second thin film encapsulation layer 16 away from the silicon-based substrate 511 and includes a red color filter unit R, a green color filter unit G, and a blue color filter unit B. The first thin film encapsulation layer 18 and the cover plate 19 are located on the side of the color filter layer 17 away from the silicon-based substrate 511. The specific materials of the first thin film encapsulation layer 18, the color filter layer 17, the second thin film encapsulation layer 16, and the cover plate 19 may use conventional materials in the art, and details are not described herein.

For example, in the display substrate 50 provided by the embodiments of the present disclosure, the orthographic projection of the light-emitting functional layer 530 on the silicon substrate 510 is within the orthographic projection of the color filter layer 17 on the silicon substrate 510.

For example, in the display substrate 50 provided by the embodiments of the present disclosure, the light-emitting element 550 including the first electrode 520, the light-emitting functional layer 530, and the second electrode 540, the first thin film encapsulation layer 18, the color filter layer 17, the second thin film encapsulation layer 16, and the cover plate 19 are all manufactured in a panel factory. In addition, the insulating layer 514 above the pad 517 is also etched in the panel factory, so as to expose the pad 517 and allow the pad 517 to be bonded with the flexible printed circuit board (FPC) or the wire. Therefore, in the embodiments of the present disclosure, the silicon substrate 510 including the light reflection layer 513 and the insulating layer 514 and being suitable for forming the light-emitting element 550 may be manufactured by a wafer factory, which not only reduces the difficulty of manufacturing the light reflection layer 513, but also facilitates the subsequent process in the panel factory.

Figure 8:
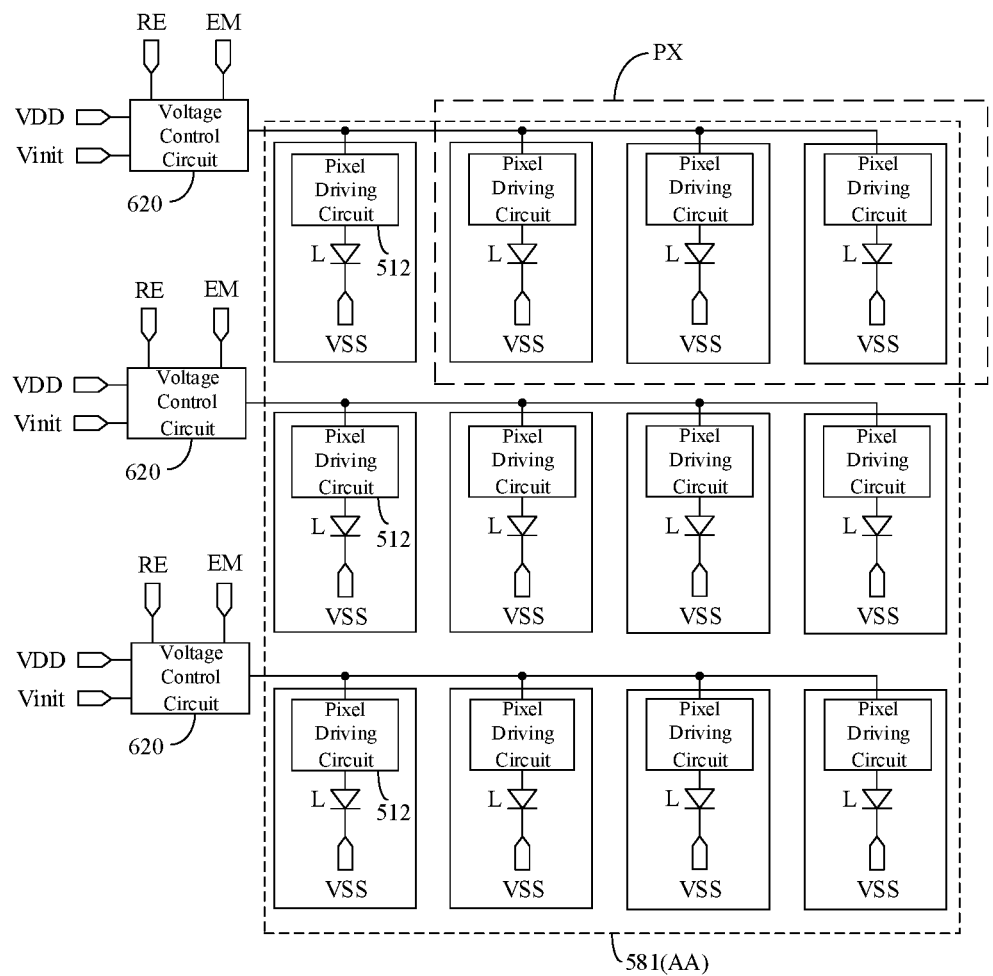
FIG. 8 is a schematic diagram of a circuit principle of a display substrate provided by some embodiments of the present disclosure.

FIG. 8 is a schematic diagram of a circuit principle of a display substrate provided by some embodiments of the present disclosure. For example, the circuit structure includes a plurality of light-emitting elements 550 (that is, the light-emitting elements L illustrated in FIG. 8) located in the display region 581 (the AA region) of the display substrate 50 illustrated in FIG. 7, and pixel driving circuits 512 coupled to the respective light-emitting elements L in one-to-one correspondence. The pixel driving circuit 512 includes a driving transistor. Moreover, the circuit structure may further include a plurality of voltage control circuits 120 located in the non-display region (i.e., an edge region of the display substrate) outside the display region 581 of the display substrate. For example, at least two pixel driving circuits 512 in a row share a voltage control circuit 620, the first electrodes of the driving transistors in the pixel driving circuits 512 in the row are coupled to the shared voltage control circuit 620, and the second electrode of each driving transistor is coupled to the corresponding light-emitting element L. The voltage control circuit 620 is configured to output an initialization signal Vinit to the first electrode of the driving transistor and control the corresponding light-emitting element L to reset in response to a reset control signal RE; and output a first power signal VDD to the first electrode of the driving transistor in response to a light-emitting control signal EM, so as to drive the light-emitting element L to emit light. By sharing the voltage control circuit 620, the structure of each pixel driving circuit in the display region may be simplified, and the area occupied by the pixel driving circuits in the display region may be reduced, so that more pixel driving circuits and light-emitting elements may be provided in the display region, thereby allowing the display panel or display device including the display substrate to achieve a high-PPI organic light-emitting display panel. Furthermore, the voltage control circuit 620 outputs the initialization signal Vinit to the first electrode of the driving transistor under control of the reset control signal RE, and controls the corresponding light-emitting element to reset, thereby avoiding the influence of the voltage applied to the light-emitting element during light emission in the previous frame on light emission in the next frame, and further ameliorating the afterimage phenomenon.

For example, the display substrate may further include a plurality of pixel units PX located in the display region 581, each pixel unit PX includes a plurality of sub-pixels, and each sub-pixel includes a light-emitting element L and a pixel driving circuit 512. Further, the pixel unit PX may include three sub-pixels of different colors. The three sub-pixels may be a red sub-pixel, a green sub-pixel, and a blue sub-pixel, respectively. Certainly, the pixel unit PX may also include 4, 5, or more sub-pixels, which needs to be designed and determined according to the actual application environment, and the embodiments of the present disclosure do not limit this.

For example, the pixel driving circuits 512 in at least two adjacent sub-pixels in the same row may share one voltage control circuit 620. For example, in some examples, as illustrated in FIG. 8, all the pixel driving circuits 512 in the same row may share one voltage control circuit 620. Alternatively, in other examples, the pixel driving circuits 512 in two, three, or more adjacent sub-pixels in the same row may share one voltage control circuit 620, and the embodiments of the present disclosure do not limit this. In this way, by sharing the voltage control circuit, the area occupied by the pixel driving circuits in the display region may be reduced.

Figure 9:
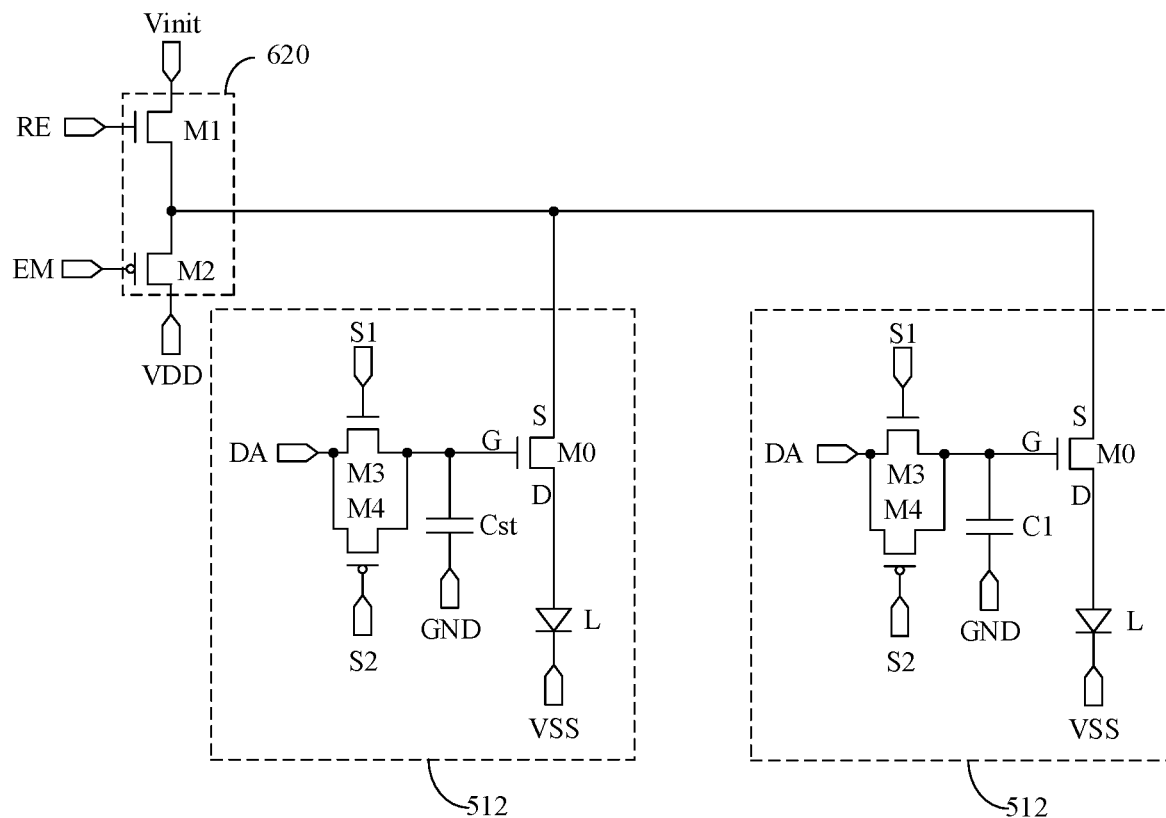
FIG. 9 is a circuit diagram of a specific implementation example of a voltage control circuit and a pixel driving circuit of a display substrate provided by some embodiments of the present disclosure.

FIG. 9 is a circuit diagram of a specific implementation example of a voltage control circuit and a pixel driving circuit of a display substrate provided by some embodiments of the present disclosure. For example, the driving transistor M0 in the pixel driving circuit 512 may be an N-type transistor. The light-emitting element L may include an OLED. In this way, the anode of the OLED is electrically connected to a second terminal D of the driving transistor M0, and the cathode of the OLED is electrically connected to a second power terminal VSS. The voltage of the second power terminal VSS is generally a negative voltage or a ground voltage VGND (generally 0V), the voltage of the initialization signal Vinit may also be the ground voltage VGND, and the embodiments of the present disclosure are not limited in this aspect. For example, the OLED may be a micro-OLED or a mini-OLED, which is further conducive to allowing the display panel or display device including the display substrate to achieve a high-PPI organic light-emitting display panel.

For example, by taking two pixel driving circuits 512 included in one row as an example, the voltage control circuit 620 may include a first switching transistor M1 and a second switching transistor M2. A gate electrode of the first switching transistor M1 is used to receive the reset control signal RE, a first electrode of the first switching transistor M1 is used to receive the initialization signal Vinit, and a second electrode of the first switching transistor M1 is coupled to the first electrode S of the corresponding driving transistor M0. A gate electrode of the second switching transistor M2 is used to receive the light-emitting control signal EM, a first electrode of the second switching transistor M2 is used to receive the first power signal VDD, and a second electrode of the second switching transistor M2 is coupled to the first electrode S of the corresponding driving transistor M0.

For example, the type of the first switching transistor M1 and the type of the second switching transistor M2 may be different. For example, the first switching transistor M1 is an N-type transistor, and the second switching transistor M2 is a P-type transistor. Alternatively, the first switching transistor M1 is a P-type transistor, and the second switching transistor M2 is an N-type transistor. Certainly, the type of the first switching transistor M1 and the type of the second switching transistor M2 may also be the same. In practical applications, the type of the first switching transistor M1 and the type of the second switching transistor M2 need to be designed according to the actual application environment, and the embodiments of the present disclosure are not limited in this aspect.

For example, the pixel driving circuit 512 may further include a third switching transistor M3 and a storage capacitor Cst. For example, a gate electrode of the third switching transistor M3 is used to receive a first gate scanning signal S1, a first electrode of the third switching transistor M3 is used to receive a data signal DA, and a second electrode of the third switching transistor M3 is coupled to the gate electrode G of the driving transistor M0. A first terminal of the storage capacitor Cst is coupled to the gate electrode G of the driving transistor M0, and a second terminal of the storage capacitor Cst is coupled to a ground terminal GND.

For example, the pixel driving circuit 512 may further include a fourth switching transistor M4. For example, a gate electrode of the fourth switching transistor M4 is used to receive a second gate scanning signal S2, a first electrode of the fourth switching transistor M4 is used to receive the data signal DA, and a second electrode of the fourth switching transistor M4 is coupled to the gate electrode G of the driving transistor M0. Also, the type of the fourth switching transistor M4 and the type of the third switching transistor M3 are different. For example, the third switching transistor M3 is an N-type transistor, and the fourth switching transistor M4 is a P-type transistor; or, the third switching transistor M3 is a P-type transistor, and the fourth switching transistor M4 is an N-type transistor.

It should be noted that in the case where the voltage of the data signal DA is a voltage corresponding to a high grayscale, the data signal DA is transmitted to the gate electrode G of the driving transistor M0, for example, by turning on the P-type fourth switching transistor M4, so as to prevent the voltage of the data signal DA from being affected by the threshold voltage of the N-type third switching transistor M3. In the case where the voltage of the data signal DA is a voltage corresponding to a low grayscale, the data signal DA is transmitted to the gate electrode G of the driving transistor M0, for example, by turning on the N-type third switching transistor M3, so as to prevent the voltage of the data signal DA from being affected by the threshold voltage of the P-type fourth switching transistor M4. This may increase the range of the voltage input to the gate electrode G of the driving transistor M0.

The driving transistor M0, the first switching transistor M1, the second switching transistor M2, the third switching transistor M3, and the fourth switching transistor M4 described above are MOS transistors manufactured in the silicon substrate.

It should be noted that, for clarity and conciseness, the embodiments of the present disclosure do not provide all constituent components of the display substrate. In order to achieve the basic functions of the display substrate, those skilled in the art may provide and set other structures not illustrated according to specific needs, and the embodiments of the present disclosure are not limited in this aspect.

At least one embodiment of the present disclosure further provides a display panel, and the display panel includes the display substrate according to any one of the embodiments of the present disclosure, and for example, the display panel may include the display substrate 10 illustrated in FIG. 1A, the display substrate 20 illustrated in FIG. 3A, the display substrate 30 illustrated in FIG. 4, the display substrate 40 illustrated in FIG. 5, the display substrate 60 illustrated in FIG. 6A, or the display substrate 50 illustrated in FIG. 7.

For example, the display panel provided by the embodiments of the present disclosure may be a virtual reality device or an augmented reality device.

For example, the display panel provided by the embodiments of the present disclosure may be a silicon-based OLED display panel or a silicon-based QLED display panel, which is not limited by the embodiments of the present disclosure.

For example, in some other embodiments of the present disclosure, the display panel may also be an electronic paper display panel or other types of panels with the display function, which is not limited by the embodiments of the present disclosure.

For example, the display panel may be any product or component with a display function, such as an electronic paper, a mobile phone, a tablet computer, a television, a display, a notebook computer, a digital photo frame, a navigator, etc. The embodiments of the present disclosure do not limit this.

The technical effects of the display panel provided by the embodiments of the present disclosure may be with reference to the technical effects of the display substrate provided by the embodiments of the present disclosure, and details are not described herein again.

At least one embodiment of the present disclosure further provides a manufacturing method of a display substrate, and the manufacturing method includes: providing a base substrate; forming a first electrode on the base substrate; forming a light-emitting functional layer on the first electrode; and forming a second electrode on the light-emitting functional layer. The second electrode covers at least one side surface of the light-emitting functional layer and a portion of a surface of the light-emitting functional layer away from the base substrate. The first electrode, the light-emitting functional layer, and the second electrode constitute a light-emitting element, the light-emitting functional layer includes a first functional layer and a second functional layer on a side of the first functional layer away from the base substrate, and a shape of the at least one side surface of the light-emitting functional layer is formed to allow a portion of the second electrode covering the at least one side surface of the light-emitting functional layer to have a component extending laterally along a surface of the base substrate.

At least one embodiment of the present disclosure further provides a manufacturing method of a display substrate, and the manufacturing method includes: providing a base substrate; forming a first electrode on the base substrate; forming a light-emitting functional layer on the first electrode; and forming a second electrode on the light-emitting functional layer. The first electrode, the light-emitting functional layer, and the second electrode constitute a light-emitting element, the light-emitting functional layer includes a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate. The second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate.

Figure 10:
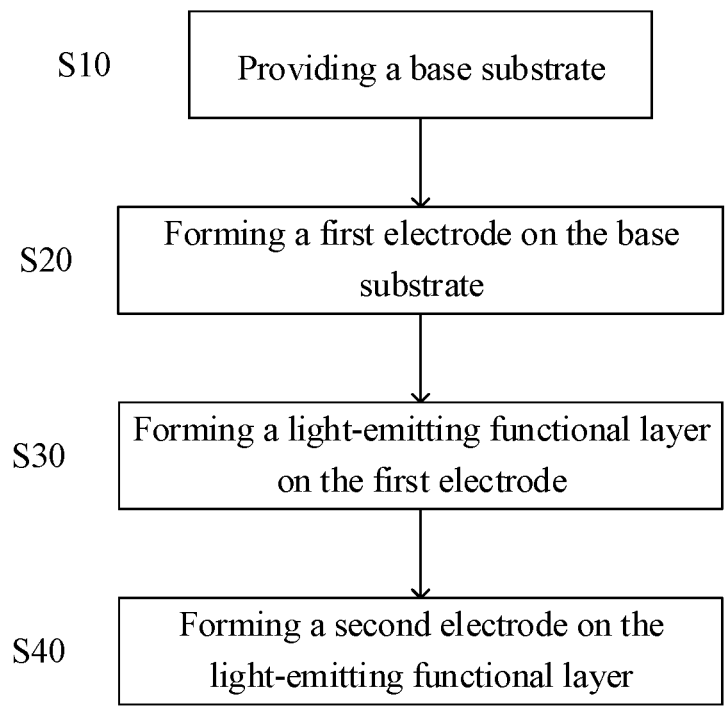
FIG. 10 is a flowchart of a manufacturing method of a display substrate provided by some embodiments of the present disclosure.

FIG. 10 is a flowchart of a manufacturing method of a display substrate provided by some embodiments of the present disclosure. For example, the manufacturing method of the display substrate includes the following steps.

Step S10: providing a base substrate.

Step S20: forming a first electrode on the base substrate.

Step S30: forming a light-emitting functional layer on the first electrode.

Step S40: forming a second electrode on the light-emitting functional layer. The second electrode covers at least one side surface of the light-emitting functional layer and a portion of a surface of the light-emitting functional layer away from the base substrate.

For example, the manufacturing method provided by the embodiments of the present disclosure may allow the portion, which covers the side surface of the light-emitting functional layer, of the second electrode in the prepared display substrate to have a component extending laterally along the surface of the base substrate, and for example, may allow the portion of the second electrode covering the side surface of the light-emitting functional layer to be in a ladder shape or a slope shape along the side surface of the light-emitting functional layer, so that the drop of the portion, which covers the at least one side surface of the light-emitting functional layer, of the second electrode in the direction perpendicular to the surface of the base substrate is reduced, that is, the drop of the second electrode at the edge of the film layer of the light-emitting element is reduced. Thus, the phenomenon of the second electrode of the manufactured display substrate being disconnected at the edge of the film layer of the light-emitting element may be reduced or avoided, so that the electrical connection of the second electrode may be significantly improved, thereby improving the overall performance and service life of the manufactured display substrate, and further improving the overall performance and service life of the display panel or display device including the manufactured display substrate.

For example, in the manufacturing method provided by some embodiments of the present disclosure, a surface of the first functional layer away from the base substrate includes a portion covered by the second functional layer, and a portion of the surface of the first functional layer away from the base substrate except for the portion covered by the second functional layer is in contact with the second electrode.

For example, in the manufacturing method provided by some embodiments of the present disclosure, a portion of the second electrode covering the at least one side surface of the light-emitting functional layer has a component extending laterally along a surface of the base substrate.

For example, in the manufacturing method provided by some embodiments of the present disclosure, the first functional layer is in contact with the second functional layer, the surface of the first functional layer away from the base substrate includes a portion in contact with the second functional layer and the portion in contact with the second electrode, a side surface of the first functional layer, the portion in contact with the second electrode of the surface of the first functional layer away from the base substrate, and a side surface of the second functional layer are in contact with each other and form a first step structure on the at least one side surface of the light-emitting functional layer, and the second electrode covers the first step structure and is in contact with the first step structure.

For example, the manufacturing method provided by some embodiments of the present disclosure further includes: forming a third functional layer on a side of the second functional layer away from the base substrate. An orthographic projection of an edge of the third functional layer on the base substrate is within the orthographic projection of the edge of the second functional layer on the base substrate, and an area of an orthographic projection of the third functional layer on the base substrate is smaller than the area of the orthographic projection of the second functional layer on the base substrate.

For example, in the manufacturing method provided by some embodiments of the present disclosure, the second functional layer is in contact with the third functional layer, a surface of the second functional layer away from the base substrate includes a portion in contact with the third functional layer and a portion in contact with the second electrode, the side surface of the second functional layer, the portion in contact with the second electrode of the surface of the second functional layer away from the base substrate, and a side surface of the third functional layer are in contact with each other and form a second step structure on the at least one side surface of the light-emitting functional layer, and the second electrode covers the second step structure and is in contact with the second step structure.

For example, in the manufacturing method provided by some embodiments of the present disclosure, a portion of the second electrode covering the first step structure and a portion of the second electrode covering the second step structure provide a first ladder structure on the at least one side surface of the light-emitting functional layer.

The technical effects of the manufacturing method of the display substrate provided by the embodiments of the present disclosure may be with reference to the technical effects of the display substrate provided by the embodiments of the present disclosure, and details are not described herein again.

The following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. However, it should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, features in one embodiment or in different embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising: a base substrate, a first electrode, a light-emitting functional layer, and a second electrode,
    wherein the first electrode is on the base substrate, the light-emitting functional layer is on a side of the first electrode away from the base substrate, the second electrode is on a side of the light-emitting functional layer away from the first electrode, and the first electrode, the light-emitting functional layer, and the second electrode constitute a light-emitting element;
    the light-emitting functional layer comprises a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and
    the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate;
    the display substrate comprises a display region and a peripheral region around the display region,
    the display substrate further comprises an auxiliary electrode in the peripheral region, the auxiliary electrode is in contact with a side surface of the first functional layer,
    the display region comprises a plurality of pixels which are not separated by the peripheral region, an edge of the first functional layer in the peripheral region is closer to the auxiliary electrode than an edge of the second functional layer in the peripheral region.

2. The display substrate according to claim 1, wherein a surface of the first functional layer away from the base substrate comprises a portion covered by the second functional layer, and
    a portion of the surface of the first functional layer away from the base substrate except for the portion covered by the second functional layer is in contact with the second electrode.

3. The display substrate according to claim 2, wherein an outline of the orthographic projection of the first functional layer on the base substrate is approximately identical to an outline of the orthographic projection of the second functional layer on the base substrate.

4. The display substrate according to claim 2, wherein a center of the orthographic projection of the first functional layer on the base substrate substantially coincides with a center of the orthographic projection of the second functional layer on the base substrate.

5. The display substrate according to claim 2, wherein a portion of the second electrode covering the at least one side surface of the light-emitting functional layer has a component extending laterally along a surface of the base substrate.

6. The display substrate according to claim 2, wherein the first functional layer is in contact with the second functional layer,
    the surface of the first functional layer away from the base substrate comprises a portion in contact with the second functional layer and the portion in contact with the second electrode, a side surface of the first functional layer, the portion in contact with the second electrode of the surface of the first functional layer away from the base substrate, and a side surface of the second functional layer are in contact with each other and form a first step structure on the at least one side surface of the light-emitting functional layer, and
    the second electrode covers the first step structure and is in contact with the first step structure.

7. The display substrate according to claim 6, wherein the light-emitting functional layer further comprises a third functional layer on a side of the second functional layer away from the base substrate,
    an orthographic projection of an edge of the third functional layer on the base substrate is within the orthographic projection of the edge of the second functional layer on the base substrate, and an area of an orthographic projection of the third functional layer on the base substrate is smaller than the area of the orthographic projection of the second functional layer on the base substrate.

8. The display substrate according to claim 7, wherein the second functional layer is in contact with the third functional layer, a surface of the second functional layer away from the base substrate comprises a portion in contact with the third functional layer and a portion in contact with the second electrode, the side surface of the second functional layer, the portion in contact with the second electrode of the surface of the second functional layer away from the base substrate, and a side surface of the third functional layer are in contact with each other and form a second step structure on the at least one side surface of the light-emitting functional layer, and the second electrode covers the second step structure and is in contact with the second step structure.

9. The display substrate according to claim 8, wherein a portion of the second electrode covering the first step structure and a portion of the second electrode covering the second step structure provide a first ladder structure on the at least one side surface of the light-emitting functional layer.

10. The display substrate according to claim 9, wherein the light-emitting functional layer further comprises a fourth functional layer on a side of the third functional layer away from the base substrate, an orthographic projection of an edge of the fourth functional layer on the base substrate is within the orthographic projection of the edge of the third functional layer on the base substrate, and an area of an orthographic projection of the fourth functional layer on the base substrate is smaller than the area of the orthographic projection of the third functional layer on the base substrate.

11. The display substrate according to claim 10, wherein the third functional layer is in contact with the fourth functional layer, a surface of the third functional layer away from the base substrate comprises a portion in contact with the fourth functional layer and a portion in contact with the second electrode, the side surface of the third functional layer, the portion in contact with the second electrode of the surface of the third functional layer away from the base substrate, and a side surface of the fourth functional layer are in contact with each other and form a third step structure on the at least one side surface of the light-emitting functional layer, and the second electrode covers the third step structure and is in contact with the third step structure.

12. The display substrate according to claim 11, wherein the portion of the second electrode covering the second step structure and a portion of the second electrode covering the third step structure provide a second ladder structure on the at least one side surface of the light-emitting functional layer.

13. The display substrate according to claim 12, wherein the light-emitting functional layer further comprises a fifth functional layer on a side of the fourth functional layer away from the base substrate, an orthographic projection of an edge of the fifth functional layer on the base substrate is within the orthographic projection of the edge of the fourth functional layer on the base substrate, and an area of an orthographic projection of the fifth functional layer on the base substrate is smaller than the area of the orthographic projection of the fourth functional layer on the base substrate.

14. The display substrate according to claim 13, wherein the fourth functional layer is in contact with the fifth functional layer, a surface of the fourth functional layer away from the base substrate comprises a portion in contact with the fifth functional layer and a portion in contact with the second electrode, the side surface of the fourth functional layer, the portion in contact with the second electrode of the surface of the fourth functional layer away from the base substrate, and a side surface of the fifth functional layer are in contact with each other and form a fourth step structure on the at least one side surface of the light-emitting functional layer, and the second electrode covers the fourth step structure and is in contact with the fourth step structure.

15. The display substrate according to claim 14, wherein the portion of the second electrode covering the third step structure and a portion of the second electrode covering the fourth step structure provide a third ladder structure on the at least one side surface of the light-emitting functional layer.

16. The display substrate according to claim 13, wherein the first functional layer is a hole injection layer, the second functional layer is a hole transport layer, the third functional layer is a light-emitting layer, the fourth functional layer is an electron transport layer, and the fifth functional layer is an electron injection layer.

17. The display substrate according to claim 2, wherein the auxiliary electrode is at least partially around the display region, the first electrode is in the display region, and the second electrode is in the display region and the peripheral region, and is electrically connected to the auxiliary electrode through a via hole or by direct contact in the peripheral region.

18. A display panel, comprising the display substrate of claim 1, wherein the display substrate comprises a base substrate, a first electrode, a light-emitting functional layer, and a second electrode;

the first electrode is on the base substrate, the light-emitting functional layer is on a side of the first electrode away from the base substrate, the second electrode is on a side of the light-emitting functional layer away from the first electrode, and the first electrode, the light-emitting functional layer, and the second electrode constitute a light-emitting element;

the light-emitting functional layer comprises a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate;

the display substrate comprises a display region and a peripheral region around the display region, the display substrate further comprises an auxiliary electrode in the peripheral region, the auxiliary electrode is in contact with a side surface of the first functional layer, the display region comprises a plurality of pixels which are not separated by the peripheral region, the edge of the first functional in the peripheral region is closer to the auxiliary electrode than the edge of the second functional layer.

19. A manufacturing method of a display substrate, comprising:

providing a base substrate;

forming a first electrode on the base substrate;

forming a light-emitting functional layer on the first electrode; and forming a second electrode on the light-emitting functional layer, wherein the first electrode, the light-emitting functional layer, and the second electrode constitute a light-emitting element, the light-emitting functional layer comprises a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate;

the display substrate comprises a display region and a peripheral region around the display region, the display substrate further comprises an auxiliary electrode in the peripheral region, the auxiliary electrode is in contact with a side surface of the first functional layer, the display region comprises a plurality of pixels which are not separated by the peripheral region, the edge of the first functional layer in the peripheral region is closer to the auxiliary electrode than the edge of the second functional layer.

20. A display substrate, comprising: a base substrate, a first electrode, a light-emitting functional layer, and a second electrode, wherein the first electrode is on the base substrate, the light-emitting functional layer is on a side of the first electrode away from the base substrate, the second electrode is on a side of the light-emitting functional layer away from the first electrode, and the first electrode, the light-emitting functional layer, and the second electrode constitute a light-emitting element;

the light-emitting functional layer comprises a first functional layer and a second functional layer on a side of the first functional layer away from the base substrate, an orthographic projection of an edge of the second functional layer on the base substrate is within an orthographic projection of an edge of the first functional layer on the base substrate, and an area of an orthographic projection of the second functional layer on the base substrate is smaller than an area of an orthographic projection of the first functional layer on the base substrate; and the second electrode covers at least one side surface of the light-emitting functional layer and a portion of a surface of the light-emitting functional layer away from the base substrate, and the second electrode is in contact with the at least one side surface of the light-emitting functional layer and the portion of the surface of the light-emitting functional layer away from the base substrate;

the display substrate comprises a display region and a peripheral region around the display region, the display substrate further comprises an auxiliary electrode in the peripheral region, the auxiliary electrode is in contact with a side surface of the first functional layer, the display region comprises a plurality of pixels which are not separated by the peripheral region, an edge of the first functional layer in the peripheral region is closer to the auxiliary electrode than an edge of the second functional layer in the peripheral region, and a bottom surface of the auxiliary electrode, and the first and second function layer is coplanar.

* * * * *